United States Patent
Lastras-Montano et al.

(10) Patent No.: US 8,041,989 B2
(45) Date of Patent: Oct. 18, 2011

(54) SYSTEM AND METHOD FOR PROVIDING A HIGH FAULT TOLERANT MEMORY SYSTEM

(75) Inventors: Luis A. Lastras-Montano, Cortlandt Manor, NY (US); James A. O'Connor, Ulster Park, NY (US); Luiz C. Alves, Hopewell Junction, NY (US); William J. Clarke, Poughkeepsie, NY (US); Timothy J. Dell, Colchester, VT (US); Thomas J. Dewkett, Staatsburg, NY (US); Kevin C. Gower, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 353 days.

(21) Appl. No.: 11/769,936

(22) Filed: Jun. 28, 2007

(65) Prior Publication Data

US 2009/0006900 A1    Jan. 1, 2009

(51) Int. Cl.
*G06F 11/00* (2006.01)
(52) U.S. Cl. ............ 714/6.2; 714/6.1; 714/6.22; 714/42
(58) Field of Classification Search ............... 714/1–57, 714/758, 763, 788; 711/114; 365/20, 200, 365/201, 230.03
See application file for complete search history.

(56) References Cited

U.S. PATENT DOCUMENTS

| | | | |
|---|---|---|---|
| 5,124,948 A * | 6/1992 | Takizawa et al. | 365/200 |
| 5,163,023 A * | 11/1992 | Ferris et al. | 365/200 |
| 5,272,671 A | 12/1993 | Kudo | |
| 5,463,643 A | 10/1995 | Gaskins | |
| 5,488,691 A * | 1/1996 | Fuoco et al. | 714/52 |
| 5,499,253 A | 3/1996 | Lary | |
| 5,513,135 A | 4/1996 | Dell et al. | |
| 5,537,665 A | 7/1996 | Patel et al. | |
| 5,680,564 A | 10/1997 | Divivier | |
| 6,012,839 A | 1/2000 | Nguyen | |
| 6,332,206 B1 | 12/2001 | Nakatsuji et al. | |

(Continued)

FOREIGN PATENT DOCUMENTS

JP   11144491 A2   5/1999

(Continued)

OTHER PUBLICATIONS

Filed contemporaneously with present application on Jun. 28, 2007. "System and Method for Error Correction and Detection in a Memory System". James A. O'Connor, et al., 53 pgs. and figures (17 sheets).

(Continued)

*Primary Examiner* — Scott T Baderman
*Assistant Examiner* — Sarai Butler
(74) *Attorney, Agent, or Firm* — Cantor Colburn LLP

(57) ABSTRACT

A system and method for providing a high fault tolerant memory system. The system includes a memory system having a memory controller, a plurality of memory modules and a mechanism. The plurality of memory modules are in communication with the memory controller and with a plurality of memory devices. The plurality of memory devices include at least one spare memory device for providing memory device sparing capability. The mechanism is for detecting that one of the memory modules has failed possibly coincident with a memory device failure on an other of the memory modules. The mechanism allows the memory system to continue to run unimpaired in the presence of the memory module failure and the possible memory device failure.

21 Claims, 7 Drawing Sheets

U.S. PATENT DOCUMENTS

| | | | |
|---|---|---|---|
| 6,381,685 B2 | 4/2002 | Dell et al. | |
| 6,418,068 B1 | 7/2002 | Raynham | |
| 6,442,726 B1* | 8/2002 | Knefel | 714/763 |
| 6,715,116 B2 | 3/2004 | Lester et al. | |
| 6,763,444 B2 | 7/2004 | Thomann | |
| 6,820,072 B1 | 11/2004 | Skaanning et al. | |
| 6,845,472 B2 | 1/2005 | Walker et al. | |
| 6,854,070 B2 | 2/2005 | Johnson et al. | |
| 6,973,612 B1 | 12/2005 | Rodi | |
| 6,988,219 B2 | 1/2006 | Hitz et al. | |
| 7,055,054 B2* | 5/2006 | Olarig | 714/5 |
| 7,099,994 B2* | 8/2006 | Thayer et al. | 711/114 |
| 7,149,945 B2* | 12/2006 | Brueggen | 714/758 |
| 7,191,257 B2* | 3/2007 | Ali Khan et al. | 710/22 |
| 7,200,780 B2 | 4/2007 | Kushida | |
| 7,320,086 B2 | 1/2008 | Majni et al. | |
| 7,409,581 B2 | 8/2008 | Santeler et al. | |
| 7,484,138 B2 | 1/2009 | Hsieh et al. | |
| 7,752,490 B2 | 7/2010 | Abe | |
| 2003/0002358 A1 | 1/2003 | Lee et al. | |
| 2003/0023930 A1* | 1/2003 | Fujiwara et al. | 714/788 |
| 2003/0208704 A1* | 11/2003 | Bartels et al. | 714/11 |
| 2004/0034818 A1 | 2/2004 | Gross et al. | |
| 2004/0123223 A1* | 6/2004 | Halford | 714/781 |
| 2004/0168101 A1 | 8/2004 | Kubo | |
| 2005/0108594 A1 | 5/2005 | Menon et al. | |
| 2005/0204264 A1* | 9/2005 | Yusa | 714/758 |
| 2006/0156190 A1 | 7/2006 | Finkelstein et al. | |
| 2006/0244827 A1 | 11/2006 | Moya | |
| 2006/0248406 A1* | 11/2006 | Qing et al. | 714/38 |
| 2006/0282745 A1 | 12/2006 | Douglas | |
| 2007/0047344 A1 | 3/2007 | Thayer et al. | |
| 2007/0050688 A1* | 3/2007 | Thayer | 714/100 |
| 2007/0101094 A1* | 5/2007 | Thayer et al. | 711/202 |
| 2007/0192667 A1* | 8/2007 | Nieto et al. | 714/780 |
| 2007/0260623 A1 | 11/2007 | Jaquette et al. | |
| 2008/0010435 A1 | 1/2008 | Smith et al. | |
| 2008/0163385 A1 | 7/2008 | Mahmoud | |
| 2008/0168329 A1* | 7/2008 | Han et al. | 714/764 |
| 2008/0222449 A1* | 9/2008 | Ramgarajan et al. | 714/6 |
| 2008/0250270 A1 | 10/2008 | Bennett | |
| 2008/0266999 A1* | 10/2008 | Thayer | 365/230.03 |
| 2009/0006886 A1 | 1/2009 | O'Connor et al. | |
| 2009/0006900 A1 | 1/2009 | Lastras-Montano | |

FOREIGN PATENT DOCUMENTS

| | | |
|---|---|---|
| WO | 2006029243 A1 | 3/2006 |

OTHER PUBLICATIONS

D. Wortzman; "Two-Tier Error Correcting Code for Memories"; vol. 26, #10, pp. 5314-5318; Mar. 1984.

The RAIDBook—A Source Book for RAID Technology by the RAID Advisory Board; Lino Lakes; MN; Jun. 9, 1993—XP002928115.

Chen, P. M., et al.; "RAID: High Performance, Reliable Secondary Storage"; ACM Computing Surveys; vo. 26, No. 2, p. 145-185; Jun. 1994.

L.A. Lastras-Montano; "A new class of array codes for memory storage"; Version—Jan. 19, 2011.

System Z GF (65536) x8 RAIM Code—Mar. 12, 2010, pp. 1-22.

* cited by examiner

SYSTEM AND METHOD FOR PROVIDING A HIGH FAULT TOLERANT MEMORY SYSTEM

CROSS-REFERENCE TO RELATED APPLICATIONS

This application contains subject matter that is related to the subject matter of a co-pending application entitled "System and Method for Error Correction and Detection in a Memory System" 11/769,929, filed contemporaneously with the present application, assigned to the same assignee as this application, and hereby incorporated by reference in its entirety.

BACKGROUND OF THE INVENTION

This invention relates generally to computer memory, and more particularly to providing a high fault tolerant RAID memory system.

Computer systems often require a considerable amount of high speed RAM (random access memory) to hold information such as operating system software, programs and other data while a computer is powered on and operational. This information is normally binary, composed of patterns of 1's and 0's known as bits of data. The bits of data are often grouped and organized at a higher level. A byte, for example, is typically composed of 8 bits, although it may be composed of additional bits (e.g. 9, 10, etc.) when the byte also includes information for use in the identification and/or correction of errors. This binary information is normally loaded into RAM from nonvolatile storage (NVS) such as hard disk drives (HDDs) during power on and initial program load (IPL) of the computer system. The data is also paged-in from and paged-out to NVS during normal computer operation. In general, all the programs and information utilized by a computer system cannot fit in the smaller, more costly dynamic RAM (DRAM), and even if it did fit, the data would be lost when the computer system is powered off. At present, it is common for NVS systems to be built using a large number of HDDs.

Computer RAM is often designed with pluggable subsystems, often in the form of modules, so that incremental amounts of RAM can be added to each computer, dictated by the specific memory requirements for each system and application. The acronym, "DIMM" refers to dual in-line memory modules, which are perhaps the most prevalent memory module currently in use. A DIMM is a thin rectangular card comprising one or more memory devices, and may also include one or more of registers, buffers, hub devices, and/or non-volatile storage (e.g., erasable programmable read only memory or "EPROM") as well as various passive devices (e.g. resistors and capacitors), all mounted to the card. In some instances, devices external to the physical memory module are still used to convey the information from the physical memory module to a memory controller, and failures of these devices can be naturally deemed failures of the memory module itself, as far as an error control code in the memory controller is concerned. Correspondingly, in the claims, a reference to the failure of a memory module applies not only to failures that are completely contained within a physical memory module, but more generally to failures that could affect a component that is required to convey information between the physical memory module and the memory controller.

DIMMs are often designed with dynamic memory chips or DRAMs that need to be regularly refreshed to prevent the data stored within them from being lost. Originally, DRAM chips were asynchronous devices, however contemporary chips, synchronous DRAM (SDRAM) (e.g. single data rate or "SDR", double data rate or "DDR", DDR2, DDR3, etc) have synchronous interfaces to improve performance. DDR devices are available that use pre-fetching along with other speed enhancements to improve memory bandwidth and to reduce latency. DDR3, for example, has a standard burst length of 8, where the term burst length refers to the number of DRAM transfers in which information is conveyed from or to the DRAM during a read or write.

Memory device densities have continued to grow as computer systems have become more powerful. Currently it is not uncommon to have the RAM content of a single computer be composed of hundreds of trillions of bits. Unfortunately, the failure of just a portion of a single RAM device can cause the entire computer system to fail. When memory errors occur, which may be "hard" (repeating) or "soft" (one-time or intermittent) failures, these failures may occur as single cell, multi-bit, full chip or full DIMM failures and all or part of the system RAM may be unusable until it is repaired. Repair turn-around-times can be hours or even days, which can have a substantial impact to a business dependent on the computer systems.

The probability of encountering a RAM failure during normal operations has continued to increase as the amount of memory storage in contemporary computers continues to grow.

Techniques to detect and correct bit errors have evolved into an elaborate science over the past several decades. Perhaps the most basic detection technique is the generation of odd or even parity where the number of 1's or 0's in a data word are "exclusive or-ed" (XOR-ed) together to produce a parity bit. For example, a data word with an even number of 1's will have a parity bit of 0 and a data word with an odd number of 1's will have a parity bit of 1, with this parity bit data appended to the stored memory data. If there is a single error present in the data word during a read operation, it can be detected by regenerating parity from the data and then checking to see that it matches the stored (originally generated) parity.

Richard Hamming recognized that the parity technique could be extended to not only detect errors, but correct errors by appending an error correction code (ECC) field, to each code word. The ECC field is a combination of different bits in the word XOR-ed together so that errors (small changes to the data word) can be easily detected, pinpointed and corrected. The number of errors that can be detected and corrected are directly related to the length of the ECC field appended to the data word. The technique includes ensuring a minimum separation distance between valid code word combinations. The greater the number of errors desired to be detected and corrected, the longer the code word, thus creating a greater distance between valid code words. The smallest distance between valid code words is known as the minimum Hamming distance of the code.

These error detection and error correction techniques are commonly used to restore data to its original/correct form in noisy communication transmission media or for storage media where there is a finite probability of data errors due to the physical characteristics of the device. The memory devices generally store data as voltage levels representing a 1 or a 0 in RAM and are subject to both device failure and state changes due to high energy cosmic rays and alpha particles. Similarly, HDDs that store 1's and 0's as magnetic fields on a magnetic surface are also subject to imperfections in the magnetic media and other mechanisms that can cause changes in the data pattern from what was originally stored.

In the 1980's, RAM memory device sizes first reached the point where they became sensitive to alpha particle hits and cosmic rays causing memory bits to flip. These particles do not damage the device but can create memory errors. These are known as soft errors, and most often affect just a single bit. Once identified, the bit failure can be corrected by simply rewriting the memory location. The frequency of soft errors has grown to the point that it has a noticeable impact on overall system reliability.

Memory ECCs, like those proposed by Hamming, use a combination of parity codes in various bit positions of the data word to allow detection and correction of errors. Every time data words are written into memory, a new ECC word needs to be generated and stored with the data, thereby allowing detection and correction of the data in cases where the data read out of memory includes an ECC code that does not match a newly calculated ECC code generated from the data being read.

The first ECCs were applied to RAM in computer systems in an effort to increase fault-tolerance beyond that allowed by previous means. Binary ECC codes were deployed that allowed for double-bit error detection (DED) and single-bit error correction (SEC). This SEC/DED ECC also allows for transparent recovery of single bit hard errors in RAM.

Scrubbing routines were also developed to help reduce memory errors by locating soft errors through a complement/re-complement process so that the soft errors could be detected and corrected.

Some storage manufacturers have used advanced ECC techniques, such as Reed-Solomon codes, to correct for full memory chip failures. Some memory system designs also have standard reserve memory chips (e.g. "spare" chips) that can be automatically introduced in a memory system to replace a faulty chip. These advancements have greatly improved RAM reliability, but as memory size continues to grow and customers' reliability expectations increase, further enhancements are needed. There is the need for systems to survive a complete DIMM failure and for the DIMM to be replaced concurrent with system operation. In addition, other failure modes must be considered which affect single points of failure between the connection between one or more DIMMs and the memory controller/embedded processor. For example, some of the connections between the memory controller and the memory device(s) may include one or more intermediate buffer(s) that may be external to the memory controller and reside on or separate from the DIMM, however upon its failure, may have the effect of appearing as a portion of a single DIMM failure, a full DIMM failure, or a broader memory system failure.

Although there is a clear need to improve computer RAM reliability (also referred to as "fault tolerance") by using even more advanced error correction techniques, attempts to do this have been hampered by impacts to available customer memory, performance, space, heat, etc. Using redundancy by including extra copies (e.g. "mirroring") of data or more sophisticated error coding techniques drives up costs, adds complexity to the design, and may impact another key business measure: time-to-market. For example, the simple approach of memory mirroring has been offered as a feature by several storage manufacturing companies. The use of memory mirroring permits systems to survive more catastrophic memory failures, but acceptance has been very low because it generally requires a doubling of the memory size on top of the base SEC/DEC ECC already present in the design, which generally leaves customers with less than 50% of the installed RAM available for system use.

ECC techniques have been used to improve availability of storage systems by correcting HDD failures so that customers do not experience data loss or data integrity issues due to failure of an HDD, while further protecting them from more subtle failure modes.

Some suppliers of storage systems have used redundant array of independent disks (RAID) techniques successfully to improve availability of HDDs to computer RAM. In many respects it is easier to recover from a HDD failure using RAID techniques because it is much easier to isolate the failure in HDDs than it is in RAM. HDDs often have embedded checkers such as ECCs to detect bad sectors. In addition, cyclic redundancy checks (CRCs) and longitudinal redundancy checks (LRCs) may be embedded in HDD electronics or disk adapters, or they may be checkers used by higher levels of code and applications to detect HDD errors. CRCs and LRCs are written coincident with data to help detect data errors. CRCs and LRCs are hashing functions used to produce a small substantially unique bit pattern generated from the data. When the data is read from the HDD, the check sum is regenerated and compared to that stored on the platter. The signatures must match exactly to ensure the data retrieved from the magnetic pattern encoded on the disk is as was originally written to the disk.

RAID systems have been developed to improve performance and/or to increase the availability of disk storage systems. RAID distributes data across several independent HDDs. There are many different RAID schemes that have been developed each having different characteristics, and different pros and cons associated with them. Performance, availability, and utilization/efficiency (the percentage of the disks that actually hold customer data) are perhaps the most important. The tradeoffs associated with various schemes have to be carefully considered because improvements in one attribute can often result in reductions in another.

RAID-0 is striping of data across multiple HDDs to improve performance. RAID-1 is mirroring of data, keeping 2 exact copies of the data on 2 different HDDs to improve availability and prevent data loss. Some RAID schemes can be used together to gain combined benefits. For example, RAID-10 is both data striping and mirroring across several HDDs in an array to improve both performance and availability.

RAID-3, RAID-4 and RAID-5 are very similar in that they use a single XOR check sum to correct for a single data element error. RAID-3 is byte-level striping with dedicated parity HDD. RAID-4 uses block level striping with a dedicated parity HDD. RAID-5 is block level striping like RAID-4, but with distributed parity. There is no longer a dedicated parity HDD. Parity is distributed substantially uniformly across all the HDDs, thus eliminating the dedicated parity HDD as a performance bottleneck. The key attribute of RAID-3, RAID-4 and RAID-5 is that they can correct a single data element fault when the location of the fault can be pinpointed through some independent means.

There is not a single universally accepted industry-wide definition for RAID-6. In general, RAID-6 refers to block or byte-level striping with dual checksums. An important attribute of RAID-6 is that it allow for correction of up to 2 data element faults when the faults can be pinpointed through some independent means. It also has the ability to pinpoint and correct a single failure when the location of the failure is not known.

FIG. 1 depicts a contemporary system composed of an integrated processor chip 100, which contains one or more processor elements and an integrated memory controller 110. In the configuration depicted in FIG. 1, multiple independent cascade interconnected memory interface busses 106 are logically aggregated together to operate in unison to support a single independent access request at a higher bandwidth with data and error detection/correction information distributed or "striped" across the parallel busses and associated devices. The memory controller 110 attaches to four narrow/high speed point-to-point memory busses 106, with each bus 106 connecting one of the several unique memory controller interface channels to a cascade interconnect memory subsystem 103 (or memory module, e.g., a DIMM) which includes at least a hub device 104 and one or more memory devices 109. Some systems further enable operations when a subset of the memory busses 106 are populated with memory subsystems 103. In this case, the one or more populated memory busses 108 may operate in unison to support a single access request.

FIG. 2 depicts a memory structure with cascaded memory modules 103 and unidirectional busses 106. One of the functions provided by the hub devices 104 in the memory modules 103 in the cascade structure is a re-drive function to send signals on the unidirectional busses 106 to other memory modules 103 or to the memory controller 110. FIG. 2 includes the memory controller 110 and four memory modules 103, on each of two memory busses 106 (a downstream memory bus with 24 wires and an upstream memory bus with 25 wires), connected to the memory controller 110 in either a direct or cascaded manner. The memory module 103 next to the memory controller 110 is connected to the memory controller 110 in a direct manner. The other memory modules 103 are connected to the memory controller 110 in a cascaded manner. Although not shown in this figure, the memory controller 110 may be integrated in the processor 100 and may connect to more than one memory bus 106 as depicted in FIG. 1.

There is a need in the art to improve failure detection and correction in memory systems. It would be desirable for a memory system to be able to survive a complete DIMM failure and for the DIMM to be replaced concurrent with system operation. It would be desirable to provide this improved level of serviceability along with the ability to substitute a spare memory device for a failing memory device concurrent with system operation. It would also be desirable to survive the failure of any device that communicates information from the memory controller to a DIEM and vice versa.

BRIEF SUMMARY OF THE INVENTION

An exemplary embodiment includes a memory system having a memory controller, a plurality of memory modules and a mechanism. The plurality of memory modules are in communication with the memory controller and with a plurality of memory devices. The plurality of memory devices include at least one spare memory device for providing memory device sparing capability. The mechanism is for detecting that one of the memory modules has failed possibly coincident with a memory device failure on an other of the memory modules. The mechanism allows the memory system to continue to ran unimpaired in the presence of the memory module failure and the possible memory device failure.

Another exemplary embodiment includes a memory controller having an interface to a plurality of memory modules and a mechanism. The memory modules are in communication with a plurality of memory devices, and the plurality of memory devices include at least one spare memory device for providing memory device sparing capability. The mechanism is for detecting that one of the memory modules has failed possibly coincident with a memory device failure on an other of the memory modules. The mechanism allows the memory system to continue to run unimpaired in the presence of the memory module failure and the possible memory device failure.

A further exemplary embodiment includes a method for detecting and correcting errors in a memory system. The method includes determining if only a single symbol error exists in the memory system. The memory system includes a plurality of memory modules having memory devices including at least one spare memory device for providing memory device sparing capability. The memory modules are accessed in unison in response to memory commands. The method further includes correcting the single symbol error in response to determining that the single symbol error is the only error that exists in the memory system. Correcting is performed for at least one of the possible memory module failures using a RAID-3 error correction code in response to determining that the error is not a single symbol error. Correcting is performed for errors remaining in the memory system after the correcting for at least one of the possible memory module failure using the RAID-3 error correction code.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Figure 1:
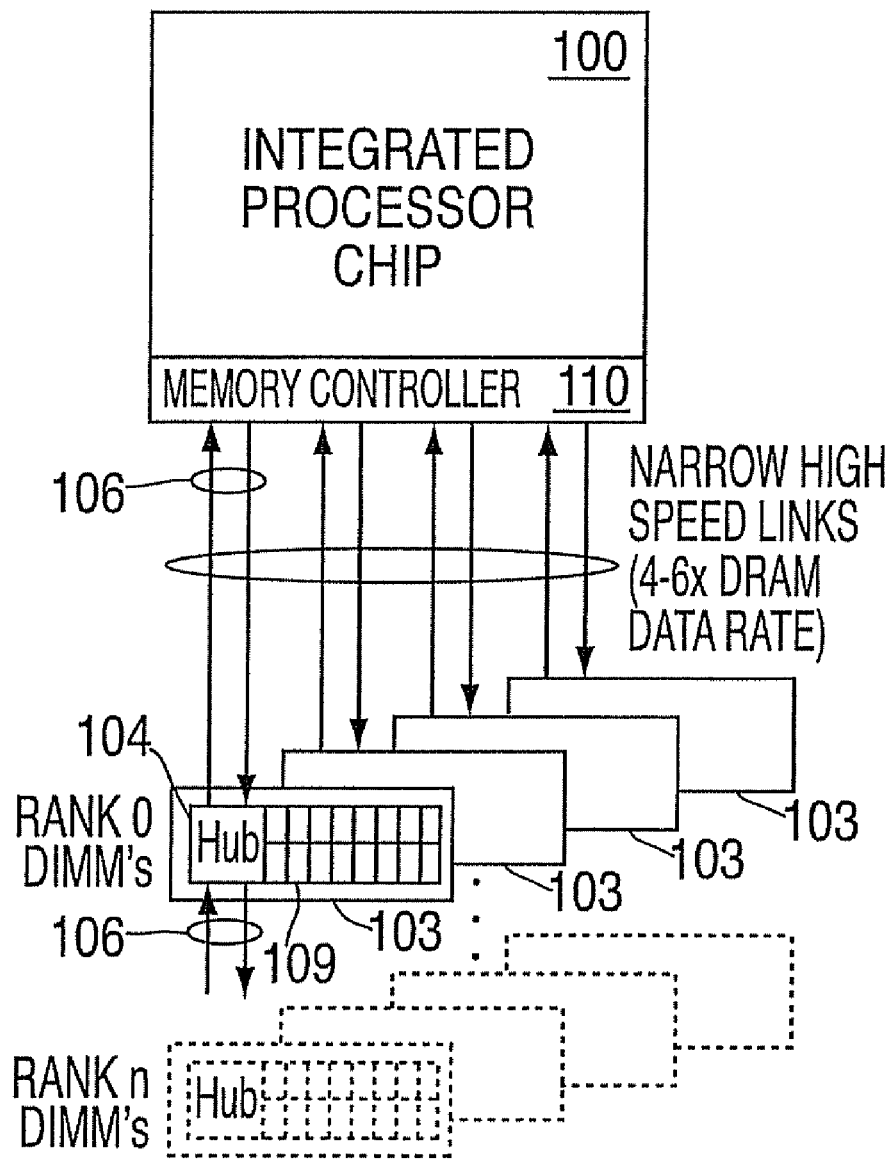
FIG. 1 depicts a cascade interconnect memory system with unidirectional busses.

An exemplary embodiment of the present invention provides transparent recovery and full on-line concurrent DIMM repair for computer memory systems comprised of RAM devices (e.g., DRAM, SDRAM, etc.). Transparent recovery for up to a complete memory subsystem (e.g., a DIMM) failure coincident with another memory chip failure is provided while still allocating one or more memory devices as spare memory devices. Exemplary embodiments utilize a node structure for the computer system RAM in conjunction with an innovative application of ECC that enables any memory node to be powered down without loss of access to the required system data stored in RAM. As such, the computer system memory continues to run unimpaired, providing full access to all data stored in RAM, just as if all the memory nodes are present, powered-on and fully operational.

As used herein, the term memory node refers to the collection of all DIMMS associated with a single logical column. Often, but not always, a single column is associated with a single memory channel. As used herein, the term coincident refers to the occurrence of two (or more) error patterns. In one example, a correctable error occurs and then later in time, before the first correctable error can be repaired, a second failure occurs. The first and second failure are said to be coincident. Repair times are always greater than zero and the longer the repair time, the more likely it would be to have a second failure occur coincident with the first.

An exemplary embodiment of the present invention implements an error correction code that is applicable to a memory system built using DDR3 DRAM parts. In the exemplary embodiment, the cache line in the processor chip is assumed to be 256 bytes. Each DIMM has 18 x4 DDR3 chips and is connected to the processor chip through a memory channel. Each DDR3 x4 chip provides over the course of 8 time beats a total of 4 bits so in total, it provides 4 bytes on a read and accepts 4 bytes on a write. Thus, a total of 4 DIMMs operating in parallel will supply the 256B cache line during a read. A fifth channel is included in the memory system, which provides enough redundancy to sustain failures of an entire memory channel. All five channels are read/written during any given access. The failures may be due to failures of devices that are critical to the communication with and operation of the DRAMs in the DIMM, for example, intermediate buffer chips, which may be located within the DIMM or elsewhere. The code is applied over 64 bytes of data, and therefore it is used 4 four times independently over the course of writing a 256B cache line to memory. Similarly, during a read the cache line is decoded by applying the error control code decoder 4 times. An important issue is how symbols in an error control code are mapped to the bits stored in the memory system. The error control code in the exemplary embodiment described herein uses an 8-bit byte (for short a byte) as the basic unit. The symbols of the error control code are formed by taking two adjacent time beats across the 4-bit I/O interface. Since there are a total of 90 chips being accessed in parallel, the above symbol definition implies that during the course of two time beats of the DRAM, 64 bytes of user data together with (up to) 26 bytes of check (or other) information are conveyed to/from the memory subsystem. See FIG. 3 for an illustration of the symbol definition adopted in exemplary embodiments of the present invention.

In some instances, it is desired to write and read only 128B worth of data. This can be accomplished via use of the DDR3 DRAM burst chop mode, which allows reads and more importantly, writes to the memory interface that last only for 4 DRAM beats (as opposed to 8). Since the error control code is applied on 64B chunks of data, the only difference with respect to the main case discussed previously is that the code is applied 2 times for burst chop mode.

Figure 4:
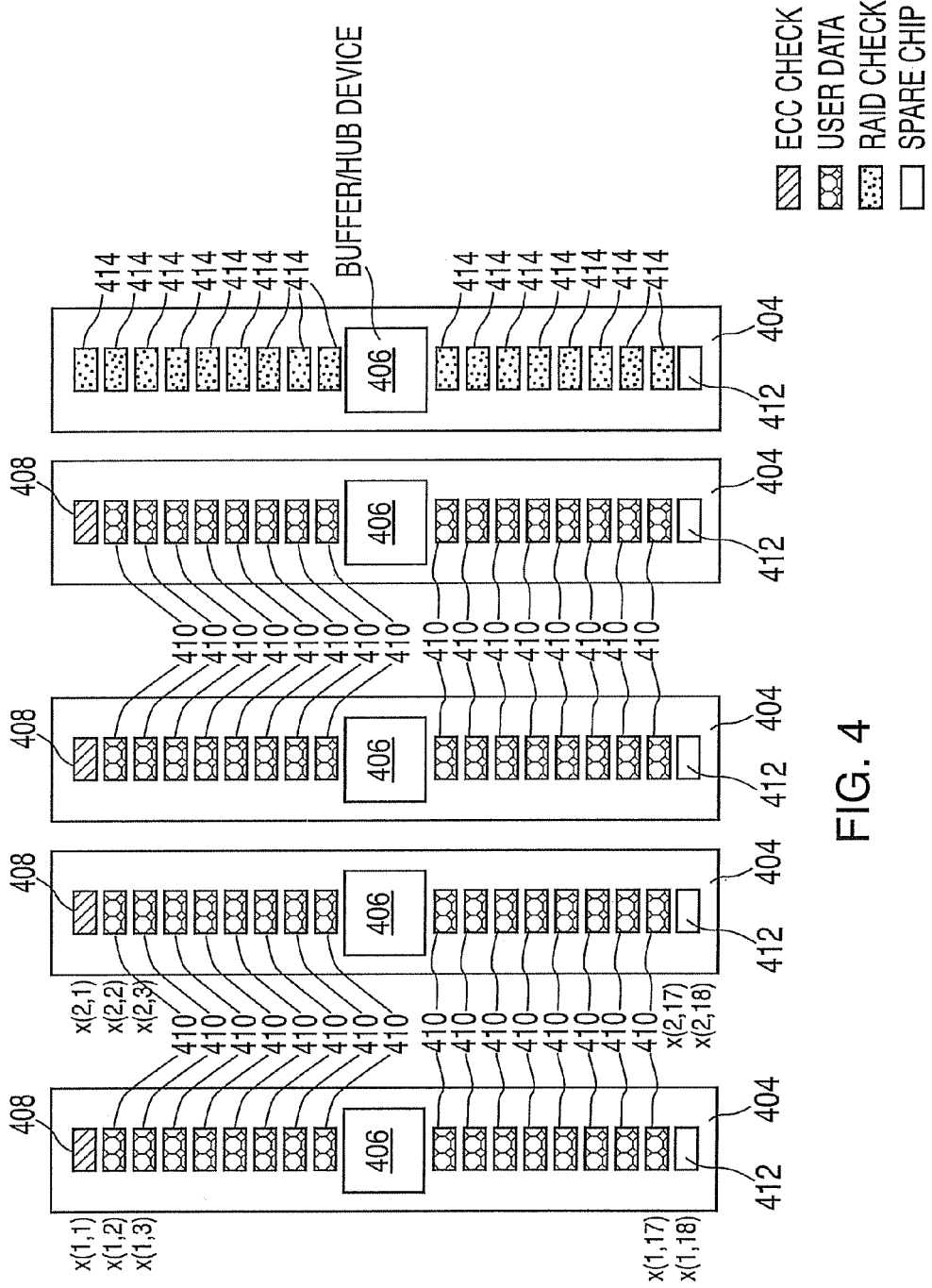
FIG. 4 depicts an exemplary system that may be implemented by an exemplary embodiment of the present invention.

An illustration of an exemplary system setup is depicted in FIG. 4. The system includes 5 DIMMs 404 each having a buffer, or hub device 406 and a plurality of memory devices 408-414. The memory devices depicted in FIG. 4 are designated as ECC check data memory devices 408, user data memory devices 410, RAID check memory devices 414, and spare chip memory devices 412 based on the contents of each memory device. As is apparent in FIG. 4, the data and ECC check symbols stored in each DIMM 404 use 17 DRAM chips. This is deliberate, as then one chip, or memory device, per DIMM may be considered a spare chip, designated as the spare chip memory device 412. The use of spare chips is common practice in current memory systems and the role of the spare chip is to serve as a recipient of the contents of another chip that is known to be failing. This process is called datasteering and is an important aspect of the continuous availability and reliability of high end computing systems.

Exemplary embodiments of the present invention add an unprecedented amount of sparing capability by having at least one spare chip per DIMM. It is pointed out, nevertheless, that these spare chips may be taken advantage of by (in particular) storing additional error control coding information. Demand for spare chips can then be serviced by degrading, on-line, the error control code capabilities by reassigning a chip that holds useful (but not essential) check information to function as a spare chip. It is stressed, nevertheless, that by an appropriate and sophisticated choice of ECC, an exemplary embodiment of the present invention provides very strong error correction properties even when the spare chips are truly inactive during normal system operation.

As described previously, the memory system is organized such that a total of four channels supply 256B of data together with some additional check information. An additional fifth channel is incorporated in order to survive major failures involving a full channel. This geometry has some inherent limitations for the purposes of recovering from a channel failure where the failing channel's identity is not known. The Rieger bound states that any linear code that is able to correct all error bursts of length "t" must have redundancy of at least "2t". By error burst of length "t" it is meant that any error that is contained within a window of length "t" located anywhere within a codeword. In an exemplary embodiment, there is the additional restriction that a channel failure is experienced as an error burst contained in any of 5 different non-overlapping windows of size 17 symbols, corresponding to each of the channels; this is, the window starting locations are restricted. Nevertheless an examination of the proof of Rieger's bound reveals that this additional constraint results in no improvement on the "2t" lower bound on redundancy.

In the memory system described above, a codeword of the error control code is comprised of 85 symbols, 64 of which are user data and therefore, the redundancy of this code is 85−64=21. A channel failure can affect up to t=17 symbols. Clearly, 2t=34>21=r and thus it can be concluded that it is impossible to recover from all such channel failures. It can be easily seen that taking further advantage of the 5 spare chips that are allocated above does not result in a change of this assessment. This however, does not preclude the possibility that channel failures and even more complex error patterns can be corrected with very high probability. In fact this is feasible and is heavily exploited in exemplary embodiments of the present invention. Once a channel failure has been encountered, a log is maintained that helps in identifying the channel that is failing. Once this channel has been identified, its identity is fed to the error control code decoder, which results in being able to correct the channel failure with 100% certainty. This is important, since if only correction with high probability is offered, after a hard channel failure has taken place eventually an access to the memory is bound to be uncorrectable. The notion of identifying failing channels and feeding the associated information to an error control decoder is referred to herein as "channel marking".

The error handling properties of the specific error control code described herein and implemented by an exemplary embodiment are summarized below:

In the absence of a channel failure (unmarked): any double symbol error correct.

In the presence of a channel failure (unmarked): the channel failure and up to 1 additional symbol failure is detected 100%; and correction of the channel failure and up to 1 additional symbol failure with very high probability (probability of non-correction is at most $2 \times 10^{-5}$ per access event). These events are always at least detected, and on the other hand, corrected with very high probability.

In the presence of a channel failure (marked), in addition to the correction of the channel failure: detection of up to 2 symbol errors is 100%; and correction of up to 1 symbol error is 100%.

Figure 3:
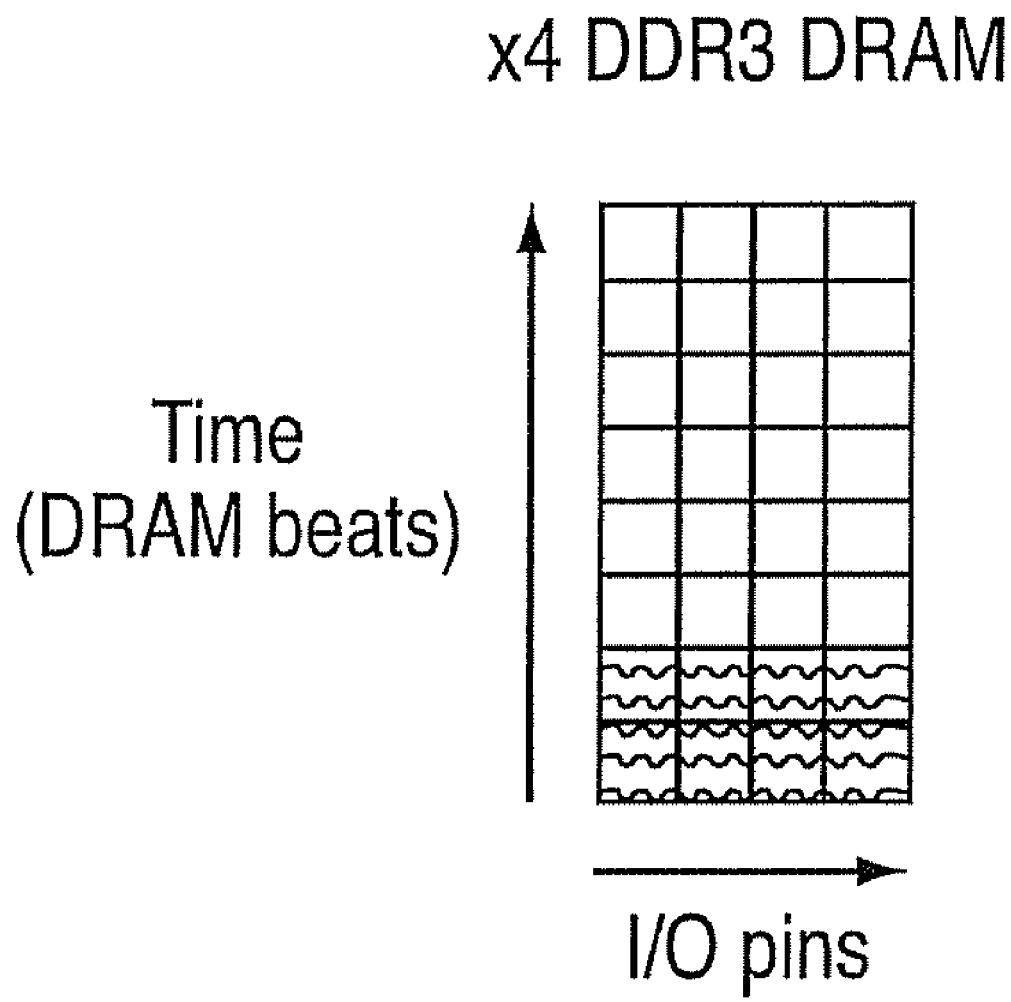
FIG. 3 is a block diagram of an exemplary symbol definition utilized by an exemplary embodiment of the present invention.

Note that in the summarized error handling properties above, "symbol error" may be replaced with "full chip error." This is due to the definition for a code symbol described in reference to FIG. 3.

Exemplary embodiments of the present invention include other desirable properties such as: the availability of a decoding algorithm that is relatively simple given the significant failure events that it allows recovery from; the parity check matrix of the code is constructed in a manner that naturally degrades to a standard double symbol error correct code if a fifth channel for storing channel failure recovery information is unavailable or undesirable; providing, as is common in error control codes applied to memory, address parity protection which gives a manner of testing whether the line requested and the line retrieved are in reality the same, reading and writing to an incorrect address may happen due to an error in the bus that conveys the address information.

Code construction. The code is constructed using arithmetic in the Galois Field with 256 elements, denoted by GF(256). For the purposes of allowing efficient hardware implementations, the field GF(256) is constructed as an extension of GF(16). Arithmetic in the field GF(16) is performed representing symbols as polynomials over GF(2). To perform multiplication of two elements of GF(16), the usual rules of multiplication of polynomials are followed (using GF(2) arithmetic) and then the module $x^4+x+1$ of the result is obtained. To construct GF(256) as an extension of GF(16), set $\beta=x^3+1$ and then use the polynomial $z^2+z+\beta$ which is irreducible over GF(16). That is, elements of GF(256) are represented as polynomials of degree at most 1, where addition and multiplication use arithmetic in GF(16) and follow the usual rules except that after multiplication, the modulo $z^2+Z+\beta$ is obtained. This construction of the finite field follows a method that is known in the art, choosing $\beta$ to be a primitive element of GF(16). This results in $z^2+z+\beta$ not being irreducible and thus the alternate choice for $\beta$ above was made.

It is noted below that the code presented is actually capable of protecting 68 bytes of user data, instead of the 64 bytes stipulated previously. To provide for the address parity protection feature, 65 bytes of data need to be protected (the 65th byte contains address information that although not stored in the memory, forms part of the error control code codeword). Also, in some computer designs, cache lines are stored together with additional information about the cache line useful in the system architecture. A larger code can always be shortened to a smaller code by simply "zeroing" entries not needed at the time of encoding and decoding.

Define: $\alpha_1=x^3+1 \in GF(16)$, $\alpha_0=x^2+x+1 \in GF(16)$. Also define: $\alpha=\alpha_1 z+\alpha_0 \in GF(256)$. It can be checked that $\alpha$ is a primitive element of GF(256). The code that is employed in an exemplary embodiment has the following parity check $$\text{matrix } H = \begin{bmatrix} I_{18} & I_{18} & I_{18} & I_{18} & I_{18} \\ H_0 & \Lambda H_0 & \Lambda^2 H_0 & \Lambda^3 H_0 & 0 \end{bmatrix}$$

where $I_{18}$ denotes the 18×18 identity matrix, $$H_0 = \begin{bmatrix} \alpha & \alpha^2 & \alpha^3 & \alpha^4 & \alpha^5 & \alpha^6 & \alpha^7 & \alpha^8 & \alpha^9 & \alpha^{10} & \alpha^{11} & \alpha^{12} & \alpha^{13} & \alpha^{14} & \alpha^{15} & \alpha^{16} & \alpha^{17} & \alpha^{18} \\ \alpha^2 & \alpha^4 & \alpha^6 & \alpha^8 & \alpha^{10} & \alpha^{12} & \alpha^{14} & \alpha^{16} & \alpha^{18} & \alpha^{20} & \alpha^{22} & \alpha^{24} & \alpha^{26} & \alpha^{28} & \alpha^{30} & \alpha^{32} & \alpha^{34} & \alpha^{36} \\ \alpha^3 & \alpha^6 & \alpha^9 & \alpha^{12} & \alpha^{15} & \alpha^{18} & \alpha^{21} & \alpha^{24} & \alpha^{27} & \alpha^{30} & \alpha^{33} & \alpha^{36} & \alpha^{39} & \alpha^{42} & \alpha^{45} & \alpha^{48} & \alpha^{51} & \alpha^{54} \\ \alpha^4 & \alpha^8 & \alpha^{12} & \alpha^{16} & \alpha^{20} & \alpha^{24} & \alpha^{28} & \alpha^{32} & \alpha^{36} & \alpha^{40} & \alpha^{44} & \alpha^{48} & \alpha^{52} & \alpha^{56} & \alpha^{60} & \alpha^{64} & \alpha^{68} & \alpha^{72} \end{bmatrix} \text{ and}$$

$$\Lambda = \begin{bmatrix} \alpha^{18} & 0 & 0 & 0 \\ 0 & \alpha^{36} & 0 & 0 \\ 0 & 0 & \alpha^{54} & 0 \\ 0 & 0 & 0 & \alpha^{72} \end{bmatrix}.$$

Let: $\hat{H}=[H_0 \; \Lambda H_0 \; \Lambda^2 H_0 \; \Lambda^3 H_0 \; 0]$.
A manner equivalent of defining $\hat{H}$ is as follows:

$\hat{H}_{i,j}=\alpha^{i \times j} 1 \leq i \leq 4, 1 \leq j \leq 72$ $\hat{H}_{i,j}=0 \; 1 \leq i \leq 4, 73 \leq j \leq 90$ The first 72 columns of $\hat{H}$ are simply a shortened [72,68] Reed-Solomon code. The properties of the code defined by parity check matrix H are sensitive to the choice of $\alpha$, so as a consequence, not every shortened Reed-Solomon will work properly. In general, in different applications of exemplary embodiments of the present invention, any appropriate shortening of a Reed-Solomon code may be utilized (not necessarily limited to selecting contiguous columns from a full length Reed-Solomon code). More generally, the choice for $\hat{H}$ is not limited to a Reed-Solomon code, provided that certain important properties next exemplified are preserved.

Define:

$\hat{H}^{(1)}=H_0$ $\hat{H}^{(2)}=\Lambda H_0$ $\hat{H}^{(3)}=\Lambda^2 H_0$ $\hat{H}^{(4)}=\Lambda^3 H_0$ $\hat{H}^{(5)}=0$ $\hat{H}^{(-1)}=[\hat{H}^{(2)}+\hat{H}^{(1)}\hat{H}^{(3)}+\hat{H}^{(1)}\hat{H}^{(4)}+\hat{H}^{(1)}\hat{H}^{(5)}+\hat{H}^{(1)}]$ $\hat{H}^{(-2)}=[\hat{H}^{(1)}+\hat{H}^{(2)}\hat{H}^{(3)}+\hat{H}^{(2)}\hat{H}^{(4)}+\hat{H}^{(2)}\hat{H}^{(5)}+\hat{H}^{(2)}]$ $\hat{H}^{(-3)}=[\hat{H}^{(1)}+\hat{H}^{(3)}\hat{H}^{(2)}+\hat{H}^{(3)}\hat{H}^{(4)}+\hat{H}^{(3)}\hat{H}^{(5)}+\hat{H}^{(3)}]$ $\hat{H}^{(-4)}=[\hat{H}^{(1)}+\hat{H}^{(4)}\hat{H}^{(2)}+\hat{H}^{(4)}\hat{H}^{(3)}+\hat{H}^{(4)}\hat{H}^{(5)}+\hat{H}^{(4)}]$ $\hat{H}^{(-5)}=[\hat{H}^{(1)}+\hat{H}^{(5)}\hat{H}^{(2)}+\hat{H}^{(5)}\hat{H}^{(3)}+\hat{H}^{(5)}\hat{H}^{(4)}+\hat{H}^{(5)}]$ equivalently stated as:

$\hat{H}^{(-1)}=[(\Lambda+I_4)H_0(\Lambda^2+I_4)H_0(\Lambda^3+I_4)H_0 H_0]$ $\hat{H}^{(-2)}=[(\Lambda+I_4)H_0(\Lambda^2+\Lambda)H_0(\Lambda^3+\Lambda)H_0 \Lambda H_0]$ $\hat{H}^{(-2)} = [(\Lambda^2 + I_4)H_0 (\Lambda^2 + \Lambda)H_0 (\Lambda^3 + \Lambda^2)H_0 \Lambda^2 H_0]$ $\hat{H}^{(-3)} = [(\Lambda^3 + I_4)H_0 (\Lambda^3 + \Lambda)H_0 (\Lambda^3 + \Lambda^2)H_0 \Lambda^3 H_0]$ $\hat{H}^{(-4)} = [H_0 \Lambda H_0 \Lambda^2 H_0 \Lambda^3 H_0]$ The minimum distances of the codes defined by parity check matrices $\hat{H}^{(-i)}$, $i \in \{1, 2, 3, 4, 5\}$ are one of the key properties of the overall code with parity check matrix H. Another key property is the minimum distances of the codes with parity check matrices $H^{(i)} + H^{(j)}$, $1 \leq i < j \leq 5$.

Let $d(\bullet)$ be a function that accepts a parity check matrix and outputs the minimum distance of the code defined by this parity check matrix. In other words, if H' is a matrix, d(H') returns the smallest number i for which there exists a nonzero vector $\xi$ with exactly i nonzero entries for which H'$\xi$=0. For the construction exhibited above, the following statements can be verified by direct computation:

$$\min_{1 \leq j \leq 5} d(H^{(-i)}) = 4$$

$$\min_{1 \leq i < j \leq 5} d(H^{(i)} + H^{(j)}) = 5$$

The latter condition implies that for any $1 \leq i < j \leq 5$, the code with parity check matrix $H^{(i)} + H^{(j)}$ is maximum-distance-separable (MDS).

Figure 2:
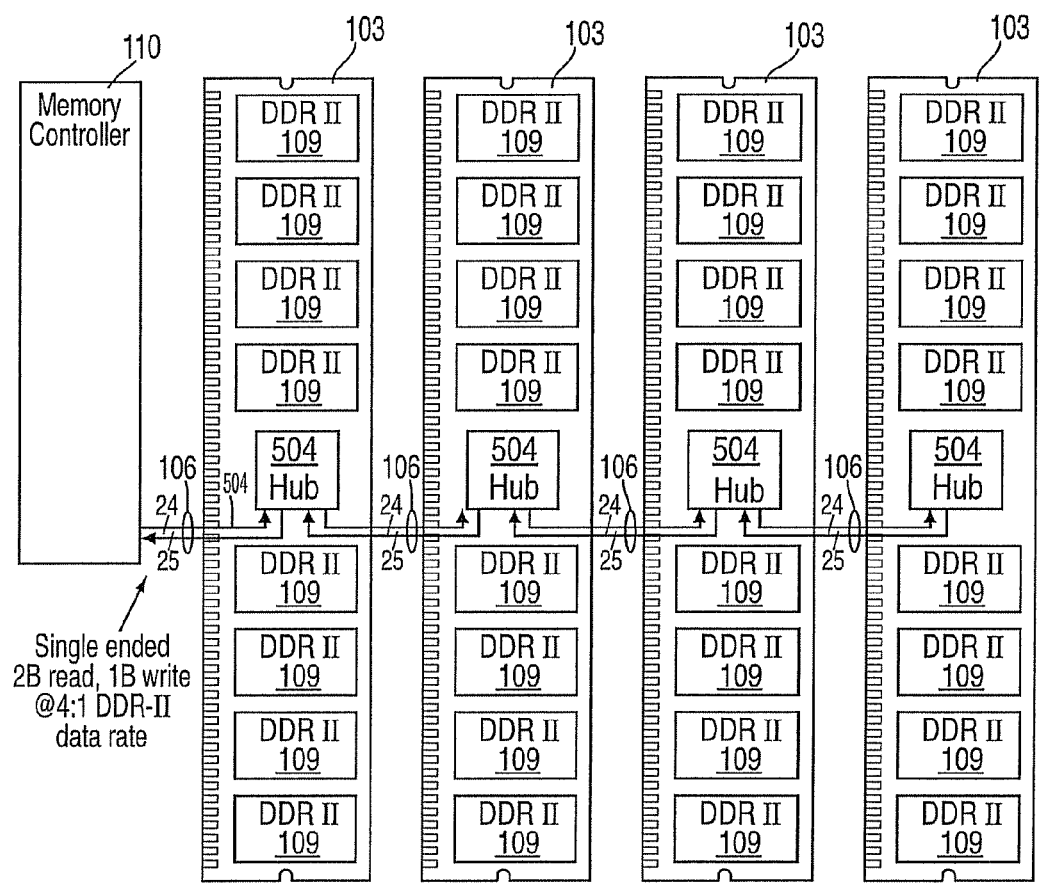
FIG. 2 depicts a cascade interconnect memory system with unidirectional busses.

Encoding. The 18 symbols associated with channel $i \in \{1, 2, 3, 4, 5\}$ are denoted by the column vector $x_i$, and the j th symbol ($j \in \{1, \ldots, 18\}$) in $x_i$ by $x_{i,j}$. When convenient, the notation $x(i,j) = x_{i,j}$ is also utilized. This notation is partially illustrated in FIG. 2. Recall, the structure of the parity check matrix:

$$H = \begin{bmatrix} I_{18} & I_{18} & I_{18} & I_{18} & I_{18} \\ H_0 & \Lambda H_0 & \Lambda^2 H_0 & \Lambda^3 H_0 & 0 \end{bmatrix}.$$

By convention, user data is stored in channels 1, 2, 3, and 4. Then, according to the definition of H, a proper codeword ($x_1, x_2, x_3, x_4, x_5$) must satisfy the equation: $x_5 = x_1 + x_2 + x_3 + x_4$. In this equation, the symbol "+" represents addition of vectors with components in GF(256). This equation provides for a means of generating check information to be stored through channel 5 once the contents of $x_1, x_2, x_3, x_4$ are known. In order to compute valid contents for $x_1, x_2, x_3, x_4$, the following equation must also be satisfied: $H_0 x_1 + \Lambda H_0 x_2 + \Lambda^2 H_0 x_3 + \Lambda^3 H_0 x_4 = 0$.

In the particular design exemplified herein, the number of rows in $H_0$ is equal to 4. It is assumed that the locations of the corresponding four check symbols computed from the user data will be stored in $x_{1,1}, x_{2,1}, x_{3,1}$ and $x_{4,1}$. This assignment is in agreement with FIG. 4.

Let:

$$\Gamma = \begin{bmatrix} \alpha^1 & \alpha^{19} & \alpha^{37} & \alpha^{55} \\ \alpha^2 & \alpha^{38} & \alpha^{74} & \alpha^{110} \\ \alpha^3 & \alpha^{57} & \alpha^{111} & \alpha^{165} \\ \alpha^4 & \alpha^{76} & \alpha^{148} & \alpha^{220} \end{bmatrix}$$

That is, $\Gamma$ is obtained from H by extracting columns 1, 19, 37, 55 (which correspond to the locations where the redundant symbols are to be placed). It can be checked that:

$$\Gamma = \begin{bmatrix} \alpha^{192} & \alpha^{212} & \alpha^{175} & \alpha^{81} \\ \alpha^{195} & \alpha^{226} & \alpha^{151} & \alpha^{102} \\ \alpha^{141} & \alpha^{134} & \alpha^{153} & \alpha^{66} \\ \alpha^{30} & \alpha^{68} & \alpha^{49} & \alpha^{228} \end{bmatrix}$$

This structure designed into the parity check matrix H permits a flexible tradeoff between computation time and implementation cost. For example at the time of decoding (a subject to be discussed in more detail below), one of the first steps is to compute the syndromes of the retrieved vector ($x_1, x_2, x_3, x_4, x_5$). These syndromes include the $\hat{H}$ syndromes which are obtained by computing: $H_0 x_1 + \Lambda H_0 x_2 + \Lambda^2 H_0 x_3 + \Lambda^3 H_0 x_4$.

As can be seen from the decomposition above, if one has sufficient hardware to multiply the matrix $H_0$ times a vector, one can reuse this hardware four times. Another possibility is to provide for hardware that allows for computation of the product of the matrix $[H_0 \Lambda H_0]$ times a vector, which then gets reused once more to accomplish the full computation.

Going back now to the matter of adjusting symbols $x_{1,1}, x_{2,1}, x_{3,1}, x_{4,1}$ so as to obtain valid codewords $x_1, x_2, x_3, x_4$. The first step is to set $x_{1,1} = x_{2,1} = x_{3,1} = x_{4,1} = 0$ and to set the rest of the symbols to the desired user data values (see FIG. 4). This results in:

$$\begin{bmatrix} x_{1,1} \\ x_{2,1} \\ x_{3,1} \\ x_{4,1} \end{bmatrix} = \Gamma^{-1}(H_0 x_1 + \Lambda H_0 x_2 + \Lambda^2 H_0 x_3 + \Lambda^3 H_0 x_4)$$

The above reflects an intended order for the computations in that only at the end is the premultiply times $\Gamma^{-1}$ performed. This ensures that a low complexity modular approach can be implemented via the techniques described previously.

Figure 5:
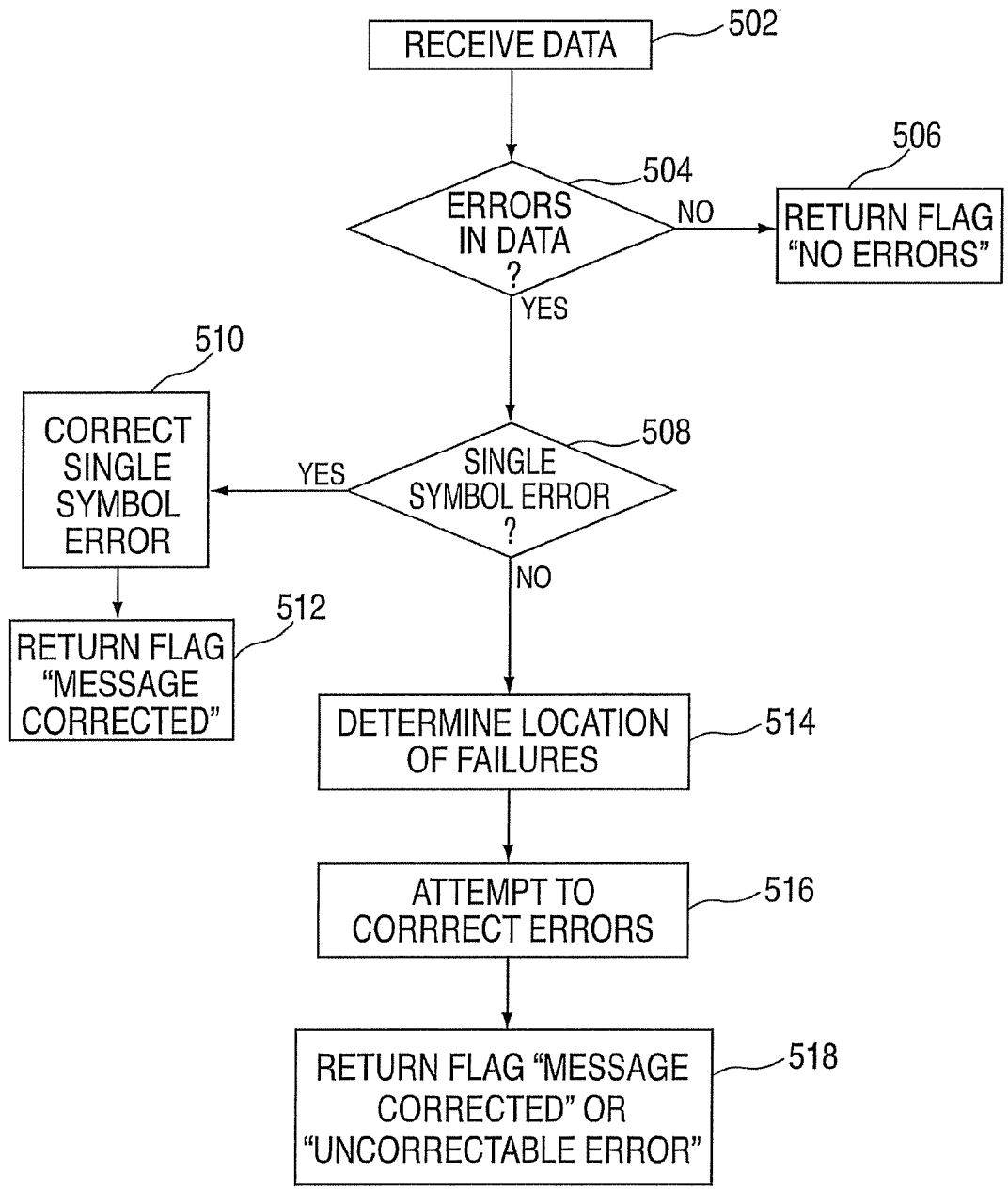
FIG. 5 is a flow diagram of an exemplary process that may be implemented by an exemplary embodiment to perform error correction.

Decoding. FIG. 5 depicts an exemplary process flow that may be implemented by exemplary embodiments of the present invention to perform error detection correction. The processing depicted in FIG. 5 may be implemented by hardware and/or software located in the memory system. At block 502, the data is received, and at block 504 it is determined whether the data contains errors. If the data does not contain errors, then block 506 is performed and a return flag is set to "no errors." If there are errors in the data, then block 508 is performed to determine if the error is a single symbol error. If the data is a single symbol error, then block 510 is performed to correct the single symbol error and then block 512 is performed to and the return flag is set to "message corrected." Blocks 508-512 allow a fast path to correct a single symbol error and to return the corrected data to the requestor. If the error is not a single symbol error, then block 514 is performed to determine the location of the failure(s). Once the location is determined, block 516 is performed to attempt to correct the errors. At block 518, the return flag is set to "message corrected" if the correction was successful and to "uncorrectable error" if the correction was not successful.

In an exemplary embodiment, the structure of the decoder (which performs the processing described in reference to FIG. 5) includes three distinct components:

Algorithm A1 is a "fast path" that corrects up to a single symbol error, and redirects the flow to Algorithm A2 is another type of error is encountered. This corresponds to block 508-512 in FIG. 5.

Algorithm A2 corrects a channel failure coincident with an additional symbol error with high probability. This algorithm is called from Algorithm A1.

Algorithm A3 corrects a marked channel failure and on top of this, performs single symbol error correction, and double symbol error detection. Algorithm A3 is invoked by Algorithm A2 multiple times. Algorithms A2 and A3 correspond to blocks 514-516 in FIG. 5.

Whenever prior channel failure information is available (that is, a particular channel has been marked as THE failing channel) then Algorithm A3 is invoked directly Algorithm A3. Otherwise, Algorithm A1 is used as the starting interface to the overall error correction algorithm.

Notation for decoding. Given a vector $\xi$, the number of nonzero entries in $\xi$ is denoted by $w(\xi)$.

The expression $F=(a==b)$ implies that F is a boolean variable that is set to true if a is equal to b and to false otherwise.

If y is a nonzero element from GF(256), $\log_\alpha y$ denotes the unique integer i such that $\alpha^i = y$. It is noted that such an integer always exists and is unique due to the fact that $\alpha$ is a primitive element of GF(256) (see the earlier definition of $\alpha$). If $y=0$, then $\log_\alpha y$ is "NaN" (not a number).

The expression a mod b denotes the remainder after integer division of a by b.

Given a chip location $L \in \{1, 2, \ldots, 72\}$ (see FIG. 4) $C(L)$ denotes the channel (or column) in which the chip is located (mathematically, $C(L)=1+(L-1)/18$, where the symbol "/" denotes integer division) and $R(L)$ denotes the row within the channel in which the chip can be found (mathematically, $R(L)=1+(L-1) \mod 18$). Note, that although mathematical expressions are given for $C(L)$ and $R(L)$, computations involving $C(L)$ and/or $R(L)$ can be obtained in hardware without direct computation according to the formulas.

Decoding Algorithm A1. The A1 Algorithm is a fast path that corrects up to a single symbol error, and redirects the flow to the other algorithms if another type of error is encountered. The input to this algorithm is a received vector x. The syndromes are computed as:

$$Z = x_1 + x_2 + x_3 + x_4 + x_5$$

$$S = H_0 x_1 + \Lambda H_0 x_2 + \Lambda^2 H_0 x_3 + \Lambda^3 H_0 x_4$$

There are 18 Z syndromes $Z_1, Z_2, \ldots, Z_{18}$ and there are four S syndromes $S_1, S_2, S_3, S_4$ If $w(Z)=w(S)=0$, then it is determined (e.g., at block 504 in FIG. 5) that no errors have taken place and exit with "NO ERRORS" as the return flag.

If $w(Z) \geq 2$ then Algorithm A2 is called because more that a single symbol error has been detected and A1 returns A2's return value.

If $w(Z)=1$ then there is a single symbol error. Let $i^* \in \{1, \ldots, 18\}$ be the unique index for which $Z_{i^*} \neq 0$. Set $E_{mag}=Z_{i^*}$. Next, if $(w(S)=0)$, it is assumed that the error is in the 5th channel, and it is corrected by setting $x_{5,i^*} \leftarrow x_{5,i^*} + Z_{i^*}$ and return "MESSAGE CORRECTED." If $w(S)>0$ then compute:

$$L_{err} = \log_\alpha(S_1/E_{mag})$$

$$F_1 = (S_1^2 == E_{mag} S_2)$$

$$F_2 = (S_1 S_2 == E_{mag} S_3)$$

$$F_3 = (S_2^2 == E_{mag} S_4)$$

If $F_1$, $F_2$ and $F_3$ are all true, $L_{err} \in \{1, 2, \ldots, 72\}$ and $R(L_{err})=i^*$, then compute the correction as $x(C(L_{err}),R(L_{err})) \leftarrow x(C(L_{err}),R(L_{err})) + E_{mag}$ and return "MESSAGE CORRECTED". Otherwise, call Algorithm A2 and A1 returns A2's return flag.

Decoding Algorithm A2. The Algorithm A2 corrects a channel failure coincident with an additional symbol error with high probability. This algorithm is called from Algorithm A1. The input to this algorithm is a vector x. The algorithm will overwrite x with a correction together with a flag (IS_CORRECTABLE) stating whether the correction was successful or not.

First, set copy $x_{original} \leftarrow x$.

Set flag IS_CORRECTABLE=False.

For each $i \in \{1, 2, 3, 4, 5\}$: make the copy $y \leftarrow x_{original}$ and call Algorithm A3 with parameters (i, y) (this is, assume channel i has failed and correct accordingly). The associated correction by A3 will be overwritten in y. If the algorithm returns "MESSAGE CORRECTED": if this is the first time this happens, set $x \leftarrow y$ and set CORRECTED=True; or If this is not the first time this has happened, and if x and y are different, then return "UNCORRECTABLE ERROR". Perform the steps for the next i.

When the processing is completed, if IS_CORRECTABLE=True, then return "MESSAGE CORRECTED", and if IS_CORRECTABLE=False then return "UNCORRECTABLE ERROR".

Decoding Algorithm A3. The Algorithm A3 corrects a marked channel failure along with a single symbol correction and double error detection. Input to this algorithm includes a channel index $j^* \in \{1, 2, 3, 4, 5\}$ and a vector x. An exemplary processing flow is as follows.

Make the substitution $$x_{j^*} \leftarrow \sum_{i \in \{1,2,3,4,5\},\{j^*\}} x_i$$

and compute the S syndromes (the Z syndromes are zero by definition): $S = H_0 x_1 + \Lambda H_0 x_2 + \Lambda^2 H_0 x_3 + \Lambda^3 H_0 x_4$. If $w(S)=0$ then return "MESSAGE CORRECTED". If $S_1=0$ or $S_2=0$ return "UNCORRECTABLE ERROR."

Compute:

$$\psi_1 = S_2/S_1$$

$$\psi_2 = S_3/S_1$$

$$E_{mag} = S_1^2/S_2$$

$$\xi = \psi_1^2 + \psi_2$$

If $\xi=0$, set $l_1=\psi_1$ and $l_2=0$.

If $\xi \neq 0$, then find the nonzero roots over GF(256) of the quadratic $z^2 + \psi_1 z + \xi = 0$. If there are two distinct nonzero roots, let $l_1$ and $l_2$ be those two roots. Otherwise, return "UNCORRECTABLE ERROR".

Determine whether the following condition is true: $(S_4 = (l_1^4 + l_2^4) E_{mag})$. If not, return "UNCORRECTABLE ERROR."

If $l_2=0$, then compute $L_{err}=\log_\alpha l_1$. If $L_{err} \in \{1, 2, 3, \ldots, 72\}$ and $j^* \in \{C(L_{err}), 5\}$, make the correction:

$$x(C(L_{err}),R(L_{err})) \leftarrow x(C(L_{err}),R(L_{err})) + E_{mag}$$

$$x(5,R(L_{err})) \leftarrow x(5,R(L_{err})) + E_{mag}$$

and return "MESSAGE CORRECTED." Otherwise, return "UNCORRECTABLE ERROR".

$l_2 \neq 0$, then compute:

$$L_{err,1} = \log_\alpha l_1$$

$L_{err,2}=\log_\alpha l_2$

Return "UNCORRECTABLE ERROR" if any of the following conditions is false: $L_{err,1}, L_{err,2} \in \{1, \ldots, 72\}$, $j^* \in \{C(L_{err,1}), C(L_{err,2})=j^*$, $C(L_{err,1}) \neq C(L_{err,2})$, and $R(L_{err,1})=R(L_{err,2})$.

Next, perform the corrections:

$$x(C(L_{err,1}), R(L_{err,1})) = x(C(L_{err,1}), R(L_{err,1})) + E_{mag}$$

$$x(C(L_{err,2}), R(L_{err,2})) = x(C(L_{err,2}), R(L_{err,2})) + E_{mag}$$

and return "MESSAGE CORRECTED."

Decoding algorithm analysis. Prior to a channel marking, it is guaranteed that: all errors affecting up to any two symbols are corrected; and all channel failures plus up to one more symbol are corrected, except with a probability $2 \times 10^{-5}$ in which only detection is assured. After channel marking, it is guaranteed that, in addition to the correction of the channel, any symbol error correct together with double symbol error detect will be performed.

Analysis for up to one symbol error. If no errors took place then $w(Z)=w(S)=0$ and Algorithm A1 returns "NO ERRORS" as desired. If there is exactly one symbol error, then $w(Z)=1$. The "Z" syndrome within the same row as the symbol error is the only nonzero syndrome; the algorithm correctly identifies the magnitude of the error $E_{mag}$ and the row in which the error is located $i^*$. If the error is in channel 5, then it does not affect the S syndrome and thus $S=0$. In this case, the algorithm succeeds in correcting the error and returning "MESSAGE CORRECTED". If the error is in channel $j^* \in \{1, 2, 3, 4\}$, then the syndromes $S_1, S_2, S_3, S_4$ are as follows:

$$S_1 = \alpha^k E_{mag}$$

$$S_2 = \alpha^{2k} E_{mag}$$

$$S_3 = \alpha^{3k} E_{mag}$$

$$S_4 = \alpha^{4k} E_{mag}$$

where $k=(j^*-1)18+i^*$. Therefore, $w(S)=4>0$. It can be readily checked that A1 will find that $F_1=F_2=F_3=F_4=$True. Also since $j^* \in \{1, 2, 3, 4\}$ and $k \in \{1, 2, 3, 4\}$, it follows that $L_{err}=\log_\alpha (S_1/E_{mag})=k \in \{1, \ldots, 72\}$. Finally, since $L_{err}=k$ then necessarily $R(L_{err})=i^*$. The algorithm has found the correct single symbol error location and proceeds with the correction as indicated, returning "MESSAGE CORRECTED."

Analysis of Algorithm A3: correcting channel failure plus up to an additional symbol error in the case where the failing channel is known. The purpose of Algorithm A3 is to decode any error in a channel potentially coincident with up to a single symbol error in some other channel. Algorithm A3 assumes that the first channel's index is given as a parameter $j^* \in \{1, 2, 3, 4, 5\}$. The successful decoding of these error events is guaranteed when correct channel index $j^*$ error information is given. Moreover, the corrections that Algorithm A3 makes are guaranteed to have exactly the same H syndrome as the received data, and an "UNCORRECTABLE ERROR" is returned otherwise. These two capabilities play a key role in Algorithm A2, which succeeds in decoding, with high probability, error patterns comprised of a channel error and up to a single symbol error when the channel that has failed is unknown. This subsection demonstrates the first capability; the latter is shown in the subsequent subsection.

Suppose that the information associated with channel $j^* \in \{1, 2, 3, 4, 5\}$ is corrupted with an error pattern. Assume that additionally, there may be a single symbol error in channel $j^{**} \in \{1, 2, 3, 4, 5\}$, $\{j^*\}$ and within that channel, row $i^{**} \in \{1, \ldots, 18\}$. It is assumed that this single symbol error has magnitude f. Algorithm A3 makes the substitution $$x_{j^*} \leftarrow \sum_{i \in \{1,2,3,4,5\}, \{j^*\}} x_i.$$

If $f=0$, then the $\hat{H}$ syndromes of x are all equal to zero ($S=0$) and A3 immediately returns with "MESSAGE CORRECTED." If $f \neq 0$, then the $\hat{H}$ syndromes of the x are as follows:

$$S_1 = (\beta + \gamma)f$$

$$S_2 = (\beta^2 + \gamma^2)f$$

$$S_3 = (\beta^3 + \gamma^3)f$$

$$S_4 = (\beta^4 + \gamma^4)f$$

where $\beta$ is equal to the element in the first row and column $i^{**}$ of $H^{(j^*)}$, and where $\gamma$ is equal to the element in the first row and column $i^{}$ of $H^{(j^{})}$. Note that $\beta$ and $\gamma$ can potentially be equal to zero (since $H^{(5)}=0$), but not simultaneously. Also, regardless of their value, it is known by construction of the check matrix $\hat{H}$ that $\beta \neq \gamma$. Therefore, $S_1 \neq 0$ and $S_2 \neq 0$, which prevents A3 from returning "UNCORRECTABLE ERROR" in the fourth step of A3.

Algorithm A3 computes $\psi_1, \psi_2, E_{mag}, \xi$, obtaining:

$$\psi_1 = \beta + \gamma$$

$$\psi_2 = \frac{\beta^3 + \gamma^3}{\beta + \gamma}$$

$$E_{mag} = f$$

$$\xi = \gamma \beta$$

Suppose that $j^*=5$. After the substitution $$x_{j^*} \leftarrow \sum_{i \in \{1,2,3,4,5\}, \{j^*\}} x_i$$

there are exactly two errors each with magnitude f, row $i^{}$ and on channels $j^{}$ and 5. It is given that $\beta=0$. Then $i=0$ and the algorithm sets $l_1=\gamma$, $l_2=0$. Note that $(l_1^3+l_2^3)E_{mag}=\gamma^3 f=S_3$. Similarly, $(l_1^4+l_2^4)E_{mag}=\gamma^4 f=S_4$ and therefore the two tests made by A3 are passed. Finally, notice that ma is the error location of the single symbol error with magnitude f not in channel 5, and thus A3 succeeds in correcting both errors, returning "MESSAGE CORRECTED."

Now assume that $j^* \in \{1, 2, 3, 4\}$ and $j^{**}=5$. After the substitution $$x_{j^*} \leftarrow \sum_{i \in \{1,2,3,4,5\}, \{j^*\}} x_i$$

there are exactly two errors each with magnitude f, row $i^{**}$ and on channels $j^*$ and 5. It is given that $\gamma=0$. Then $\xi=0$ and the algorithm sets $l_1=\beta$ and $l_2=0$. As before, A3 finds that both the $S_3$ and $S_4$ checks pass, and the correct corrections are applied, returning "MESSAGE CORRECTED." Finally, assume that $j^*, j^{**} \in \{1, 2, 3, 4\}$. In this case $\beta \neq 0$, $\gamma \neq 0$ and $\beta + \gamma \neq 0$, therefore $S_1 \neq 0$, $S_2 \neq 0$, $\xi \neq 0$. The quadratic that A3 solves is $z^2+(\alpha+\beta)z+\alpha\beta=0$, which has the two distinct roots $\alpha,\beta$. Clearly, the tests on $S_3$ and $S_4$ are passed, together with the tests performed in the previous-to-last step of A3. The appropriate corrections are made, returning "MESSAGE CORRECTED."

The above discussion establishes that A3 will indeed correct a channel failure plus up to an additional single error, if the identity of the channel failing is given.

Analysis of Algorithm A3, where all corrected messages have zero H syndrome. It is claimed herein that if "MESSAGE CORRECTED" is returned by A3, then necessarily the vector x returned by A3 satisfies $Hx=0$, regardless of the error pattern originally affecting the received data and regardless of whether the channel failure information passed to A3 is accurate or not. The first action that A3 takes is to make the correction $$x_{j^*} \leftarrow \sum_{i \in \{1,2,3,4,5\} \setminus \{j^*\}} x_i.$$

This ensures that the Z-syndromes (associated with the first 18 rows of the parity check matrix H) are identical to zero. After this correction, there are two possible additional correction actions, depending on whether channel 5 receives a correction or not. In either case, it is easy to see that the corrections preserve the value of $Z=0$. Therefore, it must be demonstrated that any time "MESSAGE CORRECTED" is returned, the $\hat{H}$ syndrome (denoted by S) of the corrected version is always equal to zero.

It is important that for the following analysis there are no assumptions about the error pattern affecting the received data. Suppose that channel 5 receives a correction (this is, $l_2=0$). A3 makes a correction in error location $\psi_1$ and error magnitude $E_{mag}$. A3 also makes a correction in channel 5, but this correction does not affect the $\hat{H}$ syndrome. Thus the claim above (for the case where channel 5 receives a correction) is true if it is demonstrated that A3 accepts the correction only if:

$$S_1 = \psi_1 E_{mag}$$
$$S_2 = \psi_1^2 E_{mag}$$
$$S_3 = \psi_1^3 E_{mag}$$
$$S_4 = \psi_1^4 E_{mag}$$

It can be easily seen that the definitions of $\psi_1$ and $E_{mag}$, which are calculated from $S_1$ and $S_2$, imply that the first two equations are always true. Moreover, this branch of A3 is invoked only if $\xi=0$, and it can be seen that this implies that the third equation is true as well. Finally, note that A3 does check the fourth equation before declaring "MESSAGE CORRECTED."

The remaining analysis is for the case when none of the corrections are in channel 5. A similar analysis concludes that by choice of $E_{mag}$, $l_1$ and $l_2$, the equations:

$$S_1=(l_1+l_2)E_{mag}$$
$$S_2=(l_1^2+l_2^2)E_{mag}$$
$$S_3=(l_1^3+l_2^3)E_{mag}$$

hold. The final necessary check $S_4=(l_1^4+l_2^4)E_{mag}$ is of course enforced by the Algorithm. This concludes the proof of the claim that if Algorithm A3 makes a correction, the resulting vector x has $Hx=0$. This is an important property of the decoding algorithm that shall be used extensively below in the analysis of Algorithm A2 and its invocation from within Algorithm A1 described below.

Analysis of Algorithm A3: detection of a single channel failure plus a double symbol error. It is demonstrated that A3 will always detect a channel failure coincident with two symbol errors, if accurate failed channel information is received by A3. Assume, that the failing channel is $j^*$ and that the channels containing the two symbol errors are $j_1^{}$ and $j_2^{}$. The possibility that $j_1^{}=j_2^{}$ is allowed. The two errors are located in rows $i_1^{}$ and $i_2^{}$, respectively. The errors are represented with column vectors with 18 zero entries except for a single entry. These column vectors are labeled $e_1$, $e_2$. After the substitution $$x_{j^*} \leftarrow \sum_{i \in \{1,2,3,4,5\} \setminus \{j^*\}} x_i,$$

the two symbol errors "propagate" to channel $j^*$, leaving a total of 3 or 4 errors (but at the same time, undoing the effect of the errors originally in channel $j^*$), depending on whether $i_1^{}=i_2^{}$ or not. The $\hat{H}$ syndrome of the received vector after the substitution is thus: $(H^{(j_1^{**})}+H^{(j^*)})e_1+(H^{(j_2^{**})}+H^{(j^*)})e_2$.

The main question is whether syndrome above can be equal to the $\hat{H}$-syndrome of a subsequent correction that A3 males, for in this case, it would be a miscorrection. Assume that a miscorrection happens and it involves a correction in channel 5. Then, the other correction is in channel $j^*$. Assume that the pattern corrected for in channel $j^*$ is represented by v, a column vector with 18 nonzero entries except for one, which is the correction. This results in: $(H^{(j_1^{**})}+H^{(j^*)})e_1+(H^{(j_2^{**})}+H^{(j^*)})e_2+H^{(j^*)}v=0$. Nevertheless, recall that $d(\hat{H}^{-j^*}) \geq 4$ as discussed previously. Therefore, it is impossible for $(H^{(j_1^{**})}+H^{(j^*)})e_1+(H^{(j_2^{**})}+H^{(j^*)})e_2+H^{(j^*)}v=0$ to hold, establishing that the assumption that a miscorrection happened involving channels $j^*$ and 5 is incorrect. The other case is when the miscorrection does not involve channel 5. A similar analysis arrives to the same conclusion.

Analysis of Algorithm A2 and its invocation from within Algorithm A1. The purpose of this subsection is to demonstrate how Algorithm A2 succeeds, through an iterative channel test method and through the use of Algorithm A3, the correction with high probability of failure events comprised of a channel failure and up to an additional symbol error.

Analysis of Algorithm A2 and its invocation from within Algorithm A1: the double symbol error case. The simplest error pattern affecting two channels is simply a double symbol error where each error is in a separate channel. In this case, the definition of which channel has failed and which channel has a single symbol error is obviously ambiguous. If the two symbol errors are in two different rows, then it is clear that Algorithm A1 calls Algorithm A2. If they are in the same row, then Algorithm A1 attempts correction. But the code with parity check matrix H has minimum distance at least 5 (this fact can be easily seen by collapsing the first 18 rows into a single row with every entry equal to 1), and therefore the double error is detected and not miscorrected. So even in this case Algorithm A2 is invoked.

Once Algorithm A2 is invoked, it tests each channel iteratively assuming that the channel tested is the one that has failed and then invokes Algorithm A3 to correct for it and up to an additional symbol error. In light of the earlier analysis of Algorithm A3, at least for two iterations Algorithm A3 will succeed in correcting for the double error, getting the same corrected message in both of these two iterations. The two iterations are the ones where A2 sets as the channel to be tested one which has a single symbol error. Thus an "UNCORRECTABLE ERROR" flag is returned if for some other iteration A3 returns "CORRECTED MESSAGE" and the message corrected is different from the earlier two corrections. In fact, it is impossible for A3 to state "CORRECTED MESSAGE" at all in this situation. When the incorrect "failing channel" information is passed, the first step in A3 (in which the failing channel is corrected for) has the effect of propagating the other two errors into the failing channel, creating 3 or 4 symbols. Nevertheless, as described previously in the analysis of Algorithm for the detection of a single channel failure plus a double symbol error, the fact that $d(\hat{H}^{-j*}) \geq 4$ implies that the resulting 3 or 4 symbol error cannot be miscorrected. Thus in fact in a double symbol error scenario, there are full error correction capabilities (no probabilities involved).

Analysis of Algorithm A2 and its invocation from within Algorithm A1: the channel failure with two or more errors plus up to an additional symbol error in some other channel. It has been assumed throughout this section that a channel failure has two or more errors. It shall now be demonstrated that successful correction of a channel failure of this type coincident with an additional channel error in some other channel is accomplished with high probability by Algorithm A2, with detection assured either way. Given $w(Z) \geq 1$ (the additional symbol error can "cancel" one of the errors in the channel that has failed, causing the associated Z syndrome to be equal to zero). If $w(Z) \geq 2$ then Algorithm A2 is invoked directly. Suppose now that $w(Z)=1$; then necessarily there are a total of three errors, two of them in the same channel. It can be demonstrated that in this case, Algorithm A1 will invoke Algorithm A2 as well. Let $j^* \in \{1, 2, 3, 4, 5\}$ be the index of the channel that has two errors. The question is whether it is possible for the conditions:

$$\log_\alpha (S_1/E_{mag}) \in \{1, 2, \ldots, 72\}$$

$$F_1 = (S_1^2 == E_{mag} S_2)$$

$$F_2 = (S_1 S_2 == E_{mag} S_3)$$

$$F_3 = (S_2^2 == E_{mag} S_4)$$

to hold.

Suppose these hold, then it can be checked that the following is true:

$$S_1 = \xi E_{mag}$$

$$S_2 = \xi^2 E_{mag}$$

$$S_3 = \xi^3 E_{mag}$$

$$S_4 = \xi^4 E_{mag}$$

for some $\xi$ with $\log_\alpha \xi \in \{1, 2, \ldots, 72\}$. The previous equations imply that the three symbol error pattern has a syndrome that is identical to the syndrome of a single symbol error. Since the code $\hat{H}$ has minimum distance 5, it is seen that this is impossible, and thus a contradiction has been arrived at. It follows that Algorithm A1 will invoke A2 on any error event comprised of a single channel failure+up to an additional symbol error.

Turning now to analyze Algorithm A2. First assume that a single channel failure has taken place (with no other error) in some channel $j^* \in \{1, 2, 3, 4, 5\}$. It is clear that when the loop in A2 invokes A3 with channel parameter $j^*$, the algorithm succeeds in correcting the channel failure, returning "CORRECTABLE ERROR". Therefore, the only way an "UNCORRECTABLE ERROR" message will be generated in Algorithm A2 is if for some other A2 loop iteration that calls A3 with channel parameter $j' \in \{1, 2, 3, 4, 5\}, \{j^*\}$, with A3 returning a "CORRECTABLE ERROR" signal with a different correction from the one obtained while executing loop iteration $j^*$.

The first problem is to determine the probability that an error in channel $j^*$ "masquerades" or "aliases" as a channel failure error (channel $j' \in \{1, 2, 3, 4, 5\}, \{j^*\}$). To complete the analysis, the probability that a failure in channel $j^*$ masquerades as a failure in another channel together with an additional symbol error must be studied.

Let $e_{j^*}$ denote the error pattern that occurred in channel $j^*$, and assume that this error pattern has exactly the same H syndrome as another error pattern $e_{j'}$ in channel $j'$. From these assumptions it can be easily deduced that $e_{j^*} + e_{j'} = 0$ and from this that: $(\hat{H}^{(j^*)} + \hat{H}^{(j')}) e_{j^*} = 0$ (5). Recall that for the code describe herein, the following conditions holds true: $d(\hat{H}^{(j^*)} + \hat{H}^{(j')}) \geq 5$. This means that any four columns of the matrix $(\hat{H}^{(j^*)} + \hat{H}^{(j')})$ are linearly independent. From this it can be easily deduced that if one assumes that $e_{j^*}$ is a vector with entries chosen independently and uniformly at random in the field GF(256), then the probability of the event (5) is equal to:

$$\frac{1}{256^4}.$$

Since there are a total of four possible locations $\{1, 2, 3, 4, 5\}, \{j^*\}$ for which an undesired correction could occur during the execution of Algorithm A2, using a probability union bound it is estimated that the probability of declaring "UNCORRECTABLE ERROR" is (approximately) at most:

$$\frac{4}{256^4}$$

if the decoder was capable of decoding only single channel failures, and nothing else. The reason for the "approximately" qualifier is related to the fact that the probabilistic error model assumed herein generates with a very small probability the "no error" pattern and also the "single symbol error" pattern, both of which are not treated directly by Algorithm A2. The resulting correction needed to obtain an actual upper bound results in a negligible correction to the estimate.

The decoding algorithm described herein is capable of decoding a channel failure plus up to an additional symbol error. Therefore as discussed previously, a channel failure can masquerade in ways beyond just a single channel failure. This additional error decoding capability will result in an upwards estimate of the above probability.

Having introduced the main idea behind the analysis, the general problem is now addressed. Assuming that the actual error event is an error $e_{j^*}$ in channel $j^*$ together with a single symbol error $e_{j^{}}$ in some other channel $j^{}$ has the same syndrome as an error pattern consisting of an error $e_{j'}$ in a channel $j' \in \{1, 2, 3, 4, 5\}, \{j^*\}$ and additionally, a single symbol error in a channel $j'' \in \{1, 2, 3, 4, 5\}, \{j''\}$. The single symbol error is represented by the error vector $e_{j''}$, which only has one nonzero entry.

From the above, it can be deduced that: $e_{j'} = e_{j^*} + e_{j''}$ and $0 = H^{(j^*)} e_{j^*} + H^{(j')} e_{j'} + H^{(j'')} e_{j''}$. Note that it is not assumed that $j^* \neq j''$ (thus, the analysis is not incomplete in this regard). These deductions imply that $(H^{(j')} + H^{(j^*)}) e_{j^*} = (H^{(j')} + H^{(j'')}) e_{j'}$. Note that there are at most $256 \times 18 \times 4 \times 4$ ways of choosing the right hand side, as one has a choice of the magnitude of the nonzero component of $e_{j''}$, its location within the vector, and the channel indexes j' and j'', Also as described previously, any four columns of the matrix $H^{(j')}+H^{(j'')}$ are linearly independent. It is concluded that the probability of declaring an "UNCORRECTABLE ERROR" in Algorithm A2 is (approximately) at most $$\frac{256 \times 18 \times 4 \times 4}{256^4} \approx 2 \times 10^{-5}$$

when the underlying error event is a single channel failure. Through a very similar analysis, an estimate can be obtained for the probability that A2 declares an "UNCORRECTABLE ERROR" for an error event comprised of a single channel error together with a single symbol failure. This analysis will result in obtaining the same estimate:

$$\frac{256 \times 18 \times 4 \times 4}{256^4} \approx 2 \times 10^{-5}.$$

Use of code in a computing system. The properties of the error handling mechanisms described in this invention make it a fairly powerful means of managing the availability, reliability and serviceability of a computer system employing it. The processing described herein is exemplary in nature and other methods may be implemented without departing from the scope of the invention. For example, via exploitation of the ideas presented in an exemplary embodiment of the present invention codes may be designed that are usable for other memory configurations, e.g. a 2+1 memory module configuration instead of a 4+1 memory module configuration, the use of chips with a different number of I/'O pins, e.g. the use of x8 or x16 chips instead of x4, a design for a different cache line size. Other variants include codes that are capable of sustaining more complex error patterns, for example a single memory module failure coincident with more than one symbol error, or that have a higher or smaller degree of chip sparing than exemplary embodiments described herein.

Use of code in a computing system: address parity protection. Address parity protection refers to protecting the system against errors in the address information transmitted between the memory controller and the memory subsystem, which can lead to storing a cache line in an incorrect location, or retrieving the incorrect cache line. Exemplary embodiments of the present invention provide for a means of detecting when this has happened provided that no additional error is present in the data retrieved. The idea is to take advantage of the fact that the code designed can actually store 17 rows of user data, not only 16. By convention, assume that in the first channel the 17th symbol stores a byte that is a hash function of the address of the cache line being stored. This is done at encoding time; the hash function could simply be the XOR of all the bytes in the address or another suitable function. This byte is never actually stored in memory, and just reinserted at the memory controller in this location after reading a cache line. Channels 2, 3 and 4 are filled with zeros, and channel 5 has the same byte is stored in channel 1. If an address error takes place, which results in a different hash function value, then this will be revealed to the code as a double symbol error in row 18, provided no additional errors exist.

Use of code in a computing system: usage of spare chips. In an exemplary embodiment of the present invention (see, for example, FIG. 4), there is one spare chip per DIMM. This spare chip (or spare memory device) can be used by steering the information in a bad chip to the spare chip. One method for sparing always spares a bad chip in a DIMM to another chip within the same DIMM. This ensures that whenever there is a DIMM or channel failure, the effect of sparing is contained within the DIMM. In case it is not desired to spare another chip beyond the one currently spared, another chip from another DIMM may be chosen to be spare into. In this situation, a DIMM or channel failure can potentially be perceived as a DIMM failure coincident with another chip failure. The error decoding algorithms presented in fact are capable of handling this event with high probability. Another possibility is to not spare an entire chip, but only a fraction of a chip (say half a chip). If only half a chip is spared, then the single spare chip per DIMM can be used to allow for two sparing actions, avoiding sparing to a separate DIMM. This has the disadvantage that an error in the chip into which sparing has been made can potentially result in a double error in the code. Nevertheless before a DIMM failure takes place the error control code is capable of recovering from such errors and after a marked DIMM failure, such errors will be at least detected. Therefore this strategy may apply in some situations.

Figure 6:
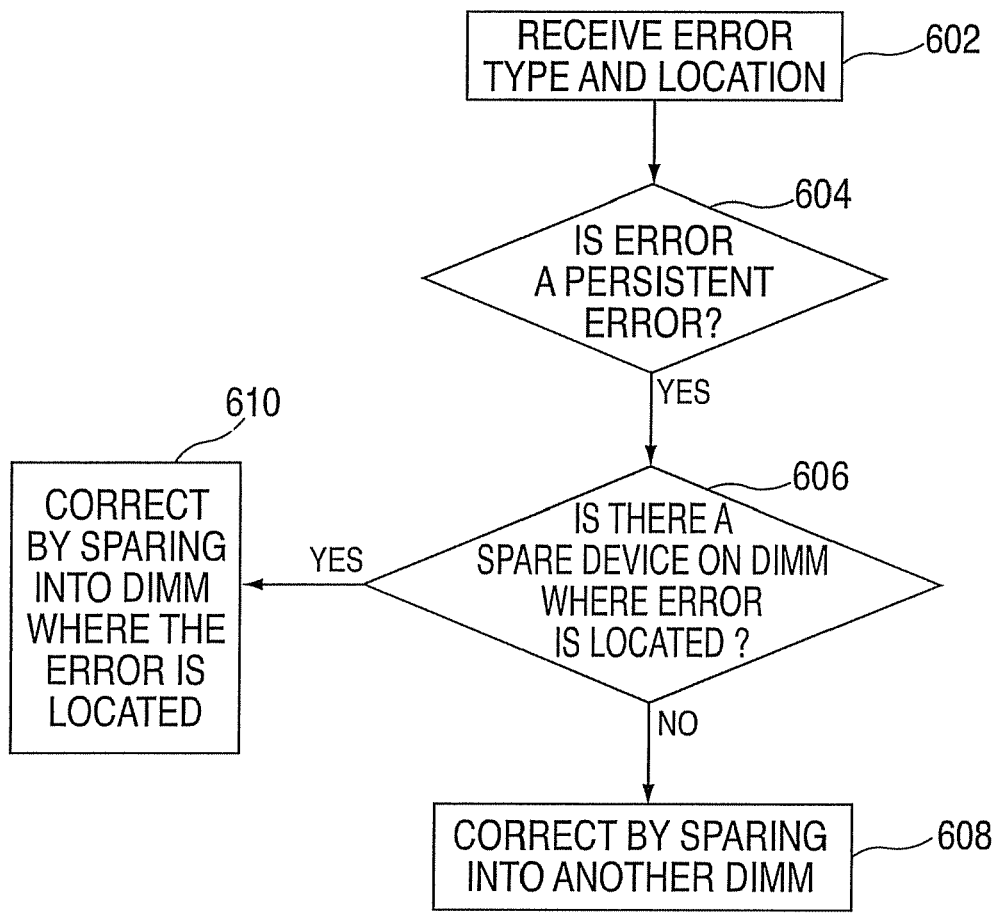
FIG. 6 is a flow diagram of an exemplary process that may be implemented by an exemplary embodiment to perform memory device sparing.

FIG. 6 depicts an exemplary process flow for performing sparing. At block 602, the error type and location is received. At block 604, it is determined if the error is a persistent error. If the error is a persistent error, then it is determined, at step 606, if there is a spare memory device on the DIMM where the error is located. If there is a spare memory device on the DIMM where the error is located then block 610 is performed and the error is corrected by sparing to the spare memory device on the DIMM. Otherwise, block 608 is performed and the error is corrected by sparing to a memory device located on another DIMM in the memory system.

Another use of the spare chips is for storage of additional check information. One reason for doing this is to reduce the probability of declaring "UNCORRECTABLE ERROR" on error events comprised of a channel failure plus up to an additional symbol error. Whenever a spare chip is invoked, the associated check information is lost, but the remaining checks in the other spare chips will still contribute to the reduction of this probability. This gives a "performance degrading" mode for the spares within the DIMM, with the base (worst case) performance measured by the $2 \times 10^{-5}$ probability estimated earlier.

Use of code in a computing system: other memory configurations. Although a very specific memory configuration and associated error correction algorithm was presented here, the general properties of the encoding and decoding algorithms can be adapted to other memory system configurations and beyond memory system problems as well. Letting M be the number of channels and N be the number of symbols per channel, a parity check matrix with the form $$H = \begin{bmatrix} I_N & I_N & \cdots & I_N \\ H^{(1)} & H^{(2)} & \cdots & H^{(M)} \end{bmatrix}$$

may be utilized where for $i \in \{1, \ldots, M\}$, $H^{(i)}$ is a matrix with r rows and N columns. Define: $H^{(-i)} = [H^{(1)}+H^{(i)} \ldots H^{(i-1)}+H^{(i)} H^{(i+1)}+H^{(i)} \ldots H^{(M)}+H^{(i)}]$. It will be advantageous, as demonstrated by this invention, to select the matrices $H^{(i)}$ so that the parameters given by:

$$\min_{1 \le i < j \le M} d(H^{(i)} + H^{(j)})$$

$$\min_{1 \le j \le M} d(H^{(-i)})$$

are as large as feasible (their maximum possible value is r+1 in both cases). The first parameter above is always at least as large as the second one, and it determines the probability that a channel error (possibly coincident with additional errors) can be only detected. The second parameter determines how many additional errors in addition to a channel failure can be tolerated by the code. Selecting appropriate matrices $H^{(i}$ to be appropriately shortened Reed-Solomon codes (with possibly one of the matrices set to zero) can result in attractive codes.

The decoding algorithm's main idea is as described herein in the description of exemplary embodiments of the present invention. Each channel is tested individually and the first N rows of the check matrix H are utilized to substitute the contents of each channel being tested using the contents of the other channels. This can potentially result in error propagation, but a sufficiently large value for $\min_{1 \le j \le M} d(H^{(-i)})$ can ensure that in spite of the error propagation, additional errors beyond the channel failure can be tolerated.

Figure 7:
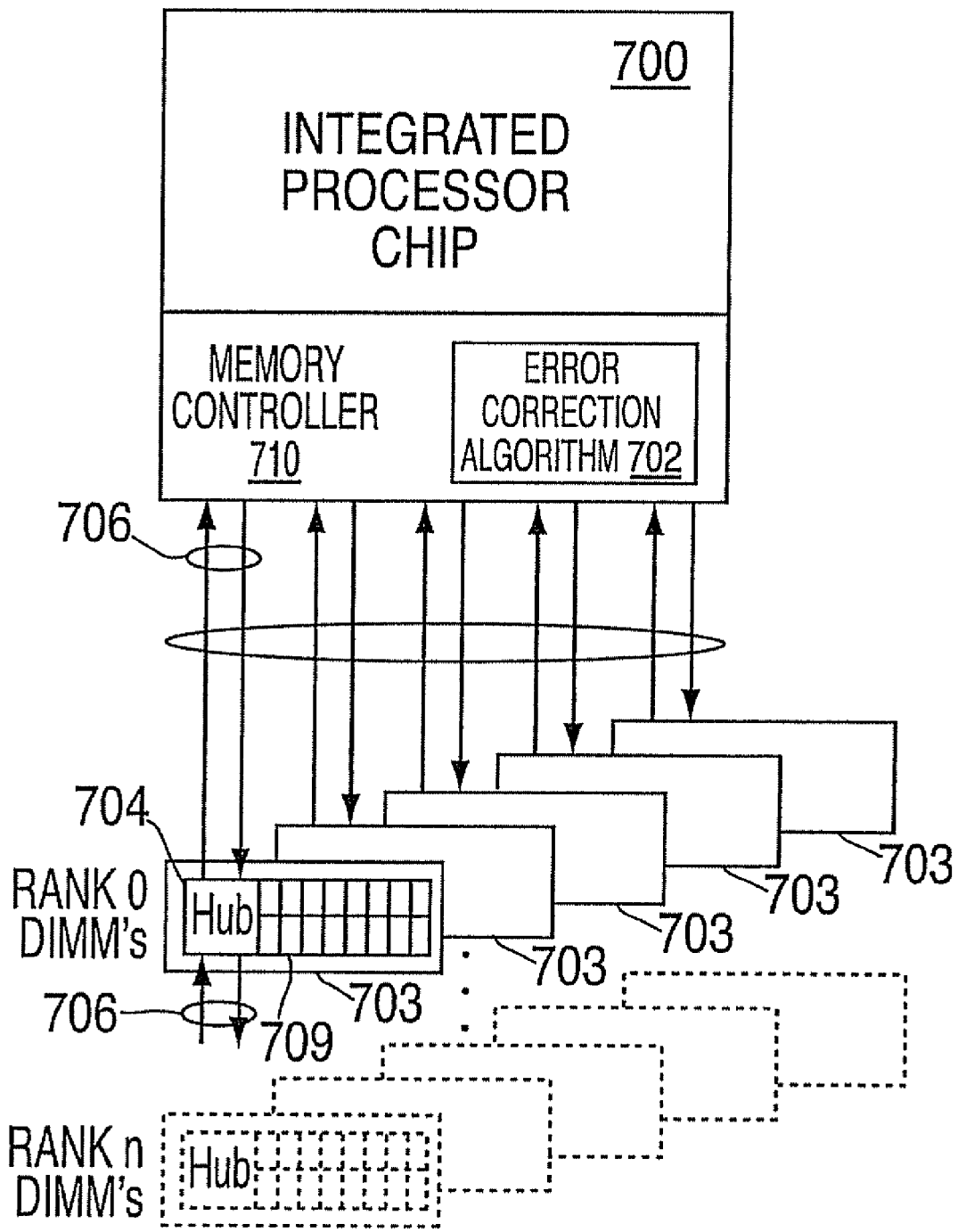
FIG. 7 is a block diagram of an exemplary system that may be implemented by an exemplary embodiment.

FIG. 7 depicts an exemplary embodiment of a system composed of an integrated processor chip 700, which contains one or more processor elements and an integrated memory controller 710. The memory controller 710 attaches to five narrow/high speed point-to-point memory busses 706, with each bus 706 connecting one of the several unique memory controller interface channels to a cascade interconnect memory subsystem 703 (or memory module, e.g., a DIMM) which includes at least a hub device 704 and one or more memory devices 709. The memory controller 700 includes an error correction algorithm 702 (which may be implemented by a mechanism) to perform the processing described herein in reference to FIG. 5. The error correction algorithm 702 may also perform the processing described herein in reference to FIG. 6. The mechanism may be implemented by hardware and/or software instructions. In an alternate exemplary embodiment, the error correction algorithm 702 is located in the processor chip 700. In another exemplary embodiment, the error correction algorithm is located on one or more of a hub device 704, the memory controller 710 and the processor 700 with processing being shared between them.

In an exemplary embodiment, hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet (s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. The DIMM depicted in FIG. 1 includes 168 pins in the exemplary embodiment, whereas subsequent DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller (s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits include the ability to implement a memory system, having spare memory devices, in an unimpaired state in the presence of a memory module failure occurring coincident with a memory device failure. This may lead to significant improvements in memory system availability and serviceability.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A memory system comprising:
a memory controller;
a plurality of memory modules connected to the memory controller and including a plurality of memory devices, the plurality of memory devices including at least one memory device for storing checkbits that are computed using data stored in memory devices located on at least two of the plurality of memory modules, and at least two of the memory devices located on at least two of the memory modules are accessed in parallel, wherein all of the memory modules are read from during every read operation;
a decoding mechanism for detecting that one of the memory modules has failed and for allowing the memory system to continue to run unimpaired in the presence of the memory module failure, the memory module failure occurring on a memory module without prior failure information, wherein the detecting is responsive to the stored checkbits and includes identifying the memory module that has failed and an additional single memory device failure coincident to the memory module failure, the additional single memory device failure occurring on a memory device on an other of the memory modules and the detecting includes identifying the memory module that has failed when the memory module failure is not coincident with a single memory device failure on a memory device on an other of the memory modules; and
a correction mechanism for correcting the memory module failure coincident to the additional single memory module failure without redirecting memory requests to a spare memory module.

2. The memory system of claim 1 wherein one or more of the memory devices is a spare memory device for providing memory device sparing capability.

3. The memory system of claim 1 wherein substantially all of the memory devices on one of the memory modules are utilized for error detection and correction across the memory modules.

4. The memory system of claim 1 wherein the detecting that one of the memory modules has failed further includes assuming that each memory module has failed individually and utilizing the checkbits stored on memory devices located on at least two of the plurality of memory modules to determine if the assumption is correct.

5. The memory system of claim 4, further comprising identifying a failing memory module, the failing memory module one of the plurality of memory modules where the assumption that the module has failed is correct.

6. The memory system of claim 1 wherein the plurality of memory modules include five memory modules connected to the memory controller via five different channels, the five memory modules including four memory modules having one memory device utilized as a spare memory device.

7. The memory system of claim 1 wherein the checkbits include a RAID-3 error correction code and the mechanism utilizes the RAID-3 error correction code applied to the memory devices organized in a row across multiple memory modules and the checkbits further include redundant symbols that are used by the mechanism to check data stored on memory devices on two or more of the memory modules.

8. The memory system of claim 1 wherein the mechanism further detects an additional memory device failure.

9. The memory system of claim 1 wherein the mechanical packaging of the memory system is adapted to allow replacement of one of the memory modules concurrent with system operation.

10. The memory system of claim 1 wherein the mechanical packaging of the memory system is adapted to allow replacement of one or more of the memory devices concurrent with system operation.

11. A memory controller comprising:
an interface to a plurality of memory modules, the modules including a plurality of memory devices, the plurality of memory devices including at least one memory device for storing checkbits that are computed using data stored in memory devices located on at least two of the plurality of memory modules, and at least two of the memory devices located on at least two of the memory modules are accessed in parallel, wherein all of the memory modules are read from during every read operation;
a decoding mechanism for detecting that one of the memory modules has failed and for allowing the memory system to continue to run unimpaired in the presence of the memory module failure, the memory module failure occurring on a memory module without prior failure information, wherein the detecting is responsive to the stored checkbits and includes identifying the memory module that has failed and an additional single memory device failure coincident to the memory module failure, the additional single memory device failure occurring on a memory device on an other of the memory modules and the detecting includes identifying the memory module that has failed when the memory module failure is not coincident with a single memory device failure on a memory device on an other of the memory modules; and a correction mechanism for correcting the memory module failure coincident to the additional single memory module failure without redirecting memory requests to a spare memory module.

12. The memory controller of claim 11 wherein one or more of the memory devices is a spare memory device for providing memory device sparing capability.

13. The memory controller of claim 11 wherein the detecting that one of the memory modules has failed further includes assuming that each memory module has failed individually and utilizing the checkbits stored on memory devices located on at least two of the plurality of memory modules to determine if the assumption is correct.

14. The memory controller of claim 11 wherein the plurality of memory modules includes five memory modules connected to the memory controller via five different channels, the five memory modules including four memory modules having one memory device utilized as a spare memory device.

15. The memory controller of claim 11 wherein the checkbits include a RAID-3 error correction code and the mechanism utilizes the RAID-3 error correction code applied to the memory devices organized in a row across multiple memory modules and the checkbits further include redundant symbols that are used by the mechanism to check data stored on memory devices on two or more of the memory modules.

16. The memory controller of claim 11 wherein the mechanism further detects an additional memory device failure.

17. A method for detecting and correcting errors in a memory system, the method comprising:

detecting that a memory module has failed, the memory module one of a plurality of memory modules connected to a memory controller and including a plurality of memory devices, at least two of the memory devices located on at least two of the memory modules accessed in parallel, wherein all of the memory modules are read from during every read operation, the memory devices including at least one memory device for storing checkbits that were computed using data stored in memory devices located on at least two of the plurality of memory modules, the memory module failure occurring without prior failure information, the detecting responsive to the stored checkbits, the detecting comprising:

identifying the memory module that has an additional single memory device failure coincident to the memory module failure, the additional single memory device failure occurring on a memory device on an other of the memory modules, and correcting the memory module failure coincident to the additional single memory device failure without redirecting memory requests to a spare memory module; and identifying the memory module that has failed when the memory module failure is not coincident with a single memory device failure on a memory device on an other of the memory modules; and allowing the memory system to continue to run unimpaired in the presence of the memory module failure.

18. The method of claim 17 further comprising identifying failing memory devices by tracking previous persistent failures, and copying data from a persistently failing memory device to a spare memory device, wherein one or more of the memory devices is a spare memory device for providing memory device sparing capability.

19. The method of claim 18, wherein the spare memory device in the memory module containing the persistently failing memory device is given preference for being utilized in the copying, and a spare memory device in an other memory module is chosen for the copying if no spare memory device in the memory module is available.

20. The method of claim 18, further comprising identifying sections of failing memory devices by tracking previous persistent failures and if the section of a failing memory device is smaller than a full memory device, copying only the failing section to a spare chip.

21. The method of claim 17 wherein the memory module failure includes a failure of any failing device that is used in communication between the memory devices and the memory controller, even if the failing device is physically not present in the failing memory module.

* * * * *